US009146280B2

(12) United States Patent
Sun et al.

(10) Patent No.: US 9,146,280 B2
(45) Date of Patent: Sep. 29, 2015

(54) METHOD AND SYSTEM FOR ESTIMATING A CAPACITY OF A BATTERY

(75) Inventors: Chein-Chung Sun, Kaohsiung (TW);
Ying-Hao Hsu, Kaohsiung (TW);
Chiu-Yu Liu, Kaohsiung (TW);
Shou-Hung Ling, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 634 days.

(21) Appl. No.: 13/282,039

(22) Filed: Oct. 26, 2011

(65) Prior Publication Data
US 2013/0110428 A1 May 2, 2013

(51) Int. Cl.
*G01R 31/36* (2006.01)

(52) U.S. Cl.
CPC .......... *G01R 31/362* (2013.01); *G01R 31/3624* (2013.01); *G01R 31/3651* (2013.01)

(58) Field of Classification Search
CPC ............. G01R 31/3679; G01R 31/361; G01R 31/3658; G01R 31/36; G01R 31/3606; G01R 31/3624
USPC .......................................................... 702/63
See application file for complete search history.

(56) References Cited

U.S. PATENT DOCUMENTS

| | | | |
|---|---|---|---|
| 6,020,720 A * | 2/2000 | Corbridge | 320/139 |
| 6,097,172 A * | 8/2000 | Podrazhansky et al. | 320/107 |
| 6,104,166 A | 8/2000 | Kikuchi et al. | |
| 6,832,171 B2 | 12/2004 | Barsoukov et al. | |
| 7,091,698 B2 | 8/2006 | Yamazaki et al. | |
| 7,098,627 B2 | 8/2006 | Nishida | |
| 7,466,138 B2 | 12/2008 | Cho et al. | |
| 7,683,581 B2 | 3/2010 | Wong et al. | |

(Continued)

FOREIGN PATENT DOCUMENTS

| | | |
|---|---|---|
| CN | 1476142 A | 2/2004 |
| CN | 101046505 A | 10/2007 |

(Continued)

OTHER PUBLICATIONS

Codecà et al., "On Battery State of Charge Estimation: A New Mixed Algorithm"; 17 IEEE International Conference on Control Applications; Part of 2008 IEEE Multi-Conference on Systems and Control; San Antonio, Texas, USA, Sep. 3-5, 2008; pp. 102-107.

(Continued)

*Primary Examiner* — Eliseo Ramos Feliciano
*Assistant Examiner* — Terence Stifter, Jr.
(74) *Attorney, Agent, or Firm* — Finnegan, Henderson, Farabow, Garrett & Dunner LLP

(57) ABSTRACT

A method for estimating a capacity of a battery includes providing a look-up table storing data relating to a voltage and a capacity of the battery, and initializing the battery to reach an initialization state which serves as a starting point for a discharging process. The method also includes discharging the battery, from the initialization state, by a first amount of charge to reach a first state, calculating an actual capacity of the battery based on a measured amount of charge discharged from the initialization state to the first state, measuring an open-circuit voltage at the first state, obtaining a look-up capacity of the battery from the look-up table according to the open-circuit voltage measured at the first state, calculating a difference between the actual capacity and the look-up capacity, and correcting the look-up table based on the difference.

26 Claims, 17 Drawing Sheets

(56) References Cited

U.S. PATENT DOCUMENTS

| | | |
|---|---|---|
| 2004/0160224 A1 | 8/2004 | Yamazaki et al. |
| 2004/0195996 A1* | 10/2004 | Nishida ............... 320/103 |
| 2006/0100800 A1* | 5/2006 | Ahmed et al. ............ 702/63 |
| 2006/0192531 A1 | 8/2006 | Nishida |
| 2006/0244458 A1 | 11/2006 | Cho et al. |
| 2008/0077338 A1 | 3/2008 | Wong et al. |
| 2009/0024339 A1 | 1/2009 | Shoji |
| 2009/0160406 A1* | 6/2009 | Sun et al. ............... 320/157 |
| 2010/0072948 A1* | 3/2010 | Sun et al. ............... 320/134 |
| 2010/0219795 A1* | 9/2010 | Morimoto et al. ........ 320/145 |
| 2011/0012604 A1* | 1/2011 | Tsujiko et al. ........... 324/427 |

FOREIGN PATENT DOCUMENTS

| | | |
|---|---|---|
| CN | 101142542 A | 3/2008 |
| CN | 101153894 A | 4/2008 |
| CN | 101285873 A | 10/2008 |
| CN | 101430366 A | 5/2009 |
| CN | 101782628 A | 7/2010 |
| CN | 102162836 A | 8/2011 |
| WO | WO 2010/091170 A1 | 8/2010 |

OTHER PUBLICATIONS

Santhanagopalan et al., "State of Charge Estimation for Electrical Vehicle Batteries"; 17 IEEE International Conference on Control Applications; Part of 2008 IEEE Multi-Conference on Systems and Control; San Antonio, Texas, USA, Sep. 3-5, 2008; pp. 690-695.

Lee et al., "The State and Parameter Estimation of an Li-Ion Battery Using a New OCV-SOC Concept"; Power Electronics Specialists Conference, 2007; PESC 2007; IEEE; pp. 2799-2803.

* cited by examiner

METHOD AND SYSTEM FOR ESTIMATING A CAPACITY OF A BATTERY

TECHNICAL FIELD

The present disclosure relates generally to a battery and, more particularly, to methods and systems for estimating a capacity of a battery.

BACKGROUND

Batteries (including non-rechargeable batteries and rechargeable batteries) have wide applications. For example, batteries are employed in electronic devices, such as mobile phones, laptop computers, and portable medical devices. Batteries are also employed in automobiles, such as gasoline or diesel powered vehicles, hybrid vehicles such as electric-gasoline powered hybrid vehicles, and purely electric vehicles.

For some battery applications, it is important to provide accurate information to users or technicians about the capacity of the battery. The capacity of the battery indicates how much charge the battery still holds (e.g., the remaining capacity), has lost (e.g., the degradation capacity), or has been discharged (e.g., the discharge capacity). Thus, the term "capacity" may refer to the discharge capacity, the degradation capacity, or the remaining capacity. It is understood that the remaining capacity may be calculated from the discharge capacity and vice versa. For example, the remaining capacity may be calculated by subtracting the discharge capacity from a maximum capacity of the battery, and the discharge capacity may be calculated by subtracting the remaining capacity from the maximum capacity. Discussions below refer to the estimation of the discharge capacity. It is understood that once the discharge capacity is estimated, the remaining capacity may be estimated from the estimated discharge capacity based on the above described relation.

The capacity of the battery may be represented using units such as watt-hours (Wh), ampere-hours (Ah), or coulombs. The capacity of the battery may also be represented by state of charge (SOC). The SOC as used herein refers to a percentage, which varies between 0% (fully discharged state) and 100% (fully charged state). The percentage representing the SOC indicates the remaining capacity relative to the full capacity of the battery at the current status. The full capacity may be equal to or closer to a nominal maximum capacity when the battery is new, and may become lower than the nominal maximum capacity after the battery has been used or after the battery has degraded. For example, when a battery is new, the nominal maximum capacity may be 7.2 Ah. Under this condition, 100% SOC means the battery capacity is 7.2 Ah, and 50% SOC means the battery capacity is 3.6 Ah. After the battery has been used, the maximum capacity may have dropped to 6.0 Ah, lower than the nominal maximum capacity. Under this condition, 100% SOC means the battery capacity is 6.0 Ah, and 50% SOC means the battery capacity is 3.0 Ah. Thus, under two different conditions, the same percentage (e.g., 50%) SOC may mean different capacities. Accordingly, using SOC for representing the remaining capacity may be misleading to users in some applications, e.g., when the users need to know how much absolute capacity remains.

In some applications, the remaining battery capacity may also be represented by an absolute state of charge (ASOC). The absolute state of charge shows the remaining capacity relative to the nominal maximum capacity when the battery is new. For example, when the battery is new, if the nominal maximum capacity is 7.2 Ah, then at any time, a 50% ASOC indicates that the battery has a capacity of 3.6 Ah remaining.

To determine the capacity of a battery, such as a rechargeable battery, some current methods utilize a look-up table that stores data relating to a voltage and a capacity of the battery. The look-up table may store data pairs of (open-circuit voltage, remaining capacity) or (open-circuit voltage, discharge capacity). Once an open-circuit voltage is measured at any given state, the capacity of the battery may be estimated from the look-up table. The data may be derived from a voltage-capacity characteristic curve of the battery. For convenience of description, the characteristic curves, rather than look-up tables, are often directly referred to in the description below.

FIG. 1 shows exemplary voltage-capacity characteristic curves of a battery. The curves shown in FIG. 1 represent a relationship between the open-circuit voltage (OCV) (vertical axis) and the discharge capacity (horizontal axis). It is understood that characteristic curves representing a relationship between the OCV and the remaining capacity may be obtained since the remaining capacity can be calculated from (maximum capacity−discharge capacity).

FIG. 1 illustrates a charge-mode characteristic curve 100 and a discharge-mode characteristic curve 110. The unit for the discharge capacity is ampere-hours (Ah). Other units, such as watt-hours (Wh) or coulombs may also be used to represent the capacity of the battery. For descriptive purposes, it is assumed the nominal maximum capacity of the battery is M1 Ah when the battery is new. The point corresponding to 0 Ah on the horizontal axis means zero charge has been discharged (e.g., used or lost), and thus, the battery is in a fully charged state with a remaining capacity of M1 Ah. The number 1.8 Ah on the horizontal axis means 1.8 Ah has been discharged (e.g., used), and thus, the remaining capacity of the battery is (M1−1.8) Ah. Given any discharge capacity D1 on the horizontal axis, the remaining capacity can be calculated as (M1−D1) Ah. The maximum capacity for a battery may depart from the nominal maximum capacity after the battery has been used. For example, due to degradation, the maximum capacity may drop from M1 Ah to (0.5*M1) Ah.

Still referring to FIG. 1, the vertical axis represents the open circuit voltage (OCV) of the battery. The open circuit voltage is measured when the battery is at an idling state. The idling state is defined as a state in which no load is applied to the electric terminals of the battery, and the battery has been at rest for more than a certain amount of time, for example, 20 minutes. When measuring the OCV, only the measuring device or circuit is connected to the electric terminals of the battery.

The terms "charge-mode" and "discharge-mode," as used in the terms "charge-mode characteristic curve" and "discharge-mode characteristic curve" do not mean that the OCV is measured when the battery is being charged (e.g., in a charging process) or being discharged (e.g., in a discharging process), because the OCV is measured in an idling state. Instead, the "charge-mode" or "discharge-mode" only means that under the current state, behavior of the battery may be described according to the charge-mode characteristic curve or the discharge-mode characteristic curve.

As illustrated in FIG. 1, each point on either the charge-mode characteristic curve 100 or the discharge-mode characteristic curve 110 corresponds to a value indicating the OCV and a value indicating the discharge capacity. Look-up tables may be provided for storing data pairs of the corresponding characteristic curve, and may be used to determine the capacity once the OCV is known. However, there may be problems associated with methods using a look-up table in estimating the capacity (e.g., the remaining capacity or the discharge capacity). For example, after the battery has been used, the battery may degrade. As a result, the maximum capacity of the battery may have dropped. In addition, the OCV-capacity relationship may change over time. Therefore, the original look-up table may not reflect the actual relationship between the OCV and the capacity. Thus, the original look-up table may not provide an accurate estimate of the capacity.

Another phenomenon that may cause problems is that the battery may exhibit two different curves, such as the charge-mode characteristic curve 100 and the discharge-mode characteristic curve 110, as shown in FIG. 1. For some batteries, the charge-mode characteristic curve and the discharge-mode characteristic curve may be identical, substantially overlap each other, or having insignificant differences, such that the two curves can be treated as a single curve without causing significant errors in estimating the remaining capacity. However, for some batteries, for example, $LiFePO_4$ type batteries, the charge-mode characteristic curve and the discharge-mode characteristic curve may exhibit substantial differences such that they may not be treated as a single curve for accurately estimating the capacity.

For example, in FIG. 1, OCV=3.3 V corresponds to two different discharge capacities, one being about 0.6 Ah, the other being about 1.3 Ah. Thus, the discharge (and the remaining) capacities determined based on these two OCV's have a difference of about 0.7 Ah, which may be significant in some applications. This problem may occur when it cannot be determined with certainty which one of the charge-mode characteristic curve 100 and the discharge-mode characteristic curve 110 (and which corresponding look-up table) should be applied to estimate the capacity.

Another phenomenon that may also cause problems in using look-up tables to estimate the capacity is illustrated in FIG. 2. When a battery (e.g., a $LiFePO_4$ type battery) transitions from a first state 105 where the discharge-mode characteristic curve 110 may be suitable for estimating the capacity, to a second state 115 where the charge-mode characteristic curve 100 may be suitable for estimating the remaining capacity, the battery may need to receive a certain amount of charge Q to complete the transition. This transition may take some time. During the transition, the battery's state may follow a route 120 shown in FIG. 2 connecting the first state 105 to the second state 115. Thus, when the OCV is measured to be 3.3 V as the battery state is following the route 120, the route 120, rather than the characteristic curves 100 and 110, should be considered to determine the capacity. Using either the charge-mode characteristic curve 100 or the discharge-mode characteristic curve 110 to estimate the capacity when the battery is in the transition state will likely cause errors in the estimate.

A further phenomenon that may cause errors in estimating the capacity using the characteristic curves and their corresponding look-up tables is that for some batteries, such as $LiFePO_4$ type batteries, the slope of the characteristic curves (OCV versus discharge capacity or OCV versus remaining capacity) tend to be relatively flat in a middle section, as shown in the exemplary OCV versus discharge capacity curve in FIG. 3. Thus, a small deviation in the measured OCV value within the middle section may nevertheless cause a large error in the estimated capacity. For example, when the battery has not reached the idling state (e.g., the battery has not been at rest for a sufficient amount of time), measuring the OCV of the battery may result in an error in the measured OCV, which may in turn lead to a significant error in the estimated capacity due to the relatively flat slope.

SUMMARY

In one exemplary embodiment, the present disclosure is directed to a method for estimating a capacity of a battery. The method includes providing a look-up table storing data relating to a voltage and a capacity of the battery; initializing the battery to reach an initialization state which serves as a starting point for a discharging process; discharging the battery, from the initialization state, by a first amount of charge to reach a first state; calculating an actual capacity of the battery based on a measured amount of charge discharged from the initialization state to the first state; measuring an open-circuit voltage at the first state; obtaining a look-up capacity of the battery from the look-up table according to the open-circuit voltage measured at the first state; calculating a difference between the actual capacity and the look-up capacity; and correcting the look-up table based on the difference.

In one exemplary embodiment, the present disclosure is directed to a non-transitory computer-readable medium, encoded with computer program code, which when executed by a computer, performs a method for estimating a capacity of a battery. The method includes providing a look-up table storing data relating to a voltage and a capacity of the battery; initializing the battery to reach an initialization state which serves as a starting point for a discharging process; discharging the battery, from the initialization state, by a first amount of charge to reach a first state; calculating an actual capacity of the battery based on a measured amount of charge discharged from the initialization state to the first state; measuring an open-circuit voltage at the first state; obtaining a look-up capacity of the battery from the look-up table according to the open-circuit voltage measured at the first state; calculating a difference between the actual capacity and the look-up capacity; and correcting the look-up table based on the difference.

In one exemplary embodiment, the present disclosure is directed to a system for estimating a capacity of a battery. The system includes a capacity estimation apparatus configured to initialize the battery to reach an initialization state which serves as a starting point for a discharging process; a control unit configured to generate a control signal; and a load configured to receive the control signal from the control unit and controlled by the control unit to discharge the battery, from the initialization state, by a first amount of charge to reach a first state. The capacity estimation apparatus includes a storage unit configured to store a look-up table storing data relating to a voltage and a capacity of the battery; a charge measuring unit configured to calculate an actual capacity of the battery based on a measured amount of charge discharged from the initialization state to the first state; a voltage measuring unit configured to measure an open-circuit voltage at the first state; and a processor. The processor is configured to obtain a look-up capacity of the battery from the look-up table according to the open-circuit voltage measured at the first state; calculate a difference between the actual capacity and the look-up capacity; and correct the look-up table based on the difference.

Features and advantages consistent with the disclosure will be set forth in part in the description which follows, and in part will be apparent from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems and methods consistent with aspects related to the invention as recited in the appended claims.

Figure 4:
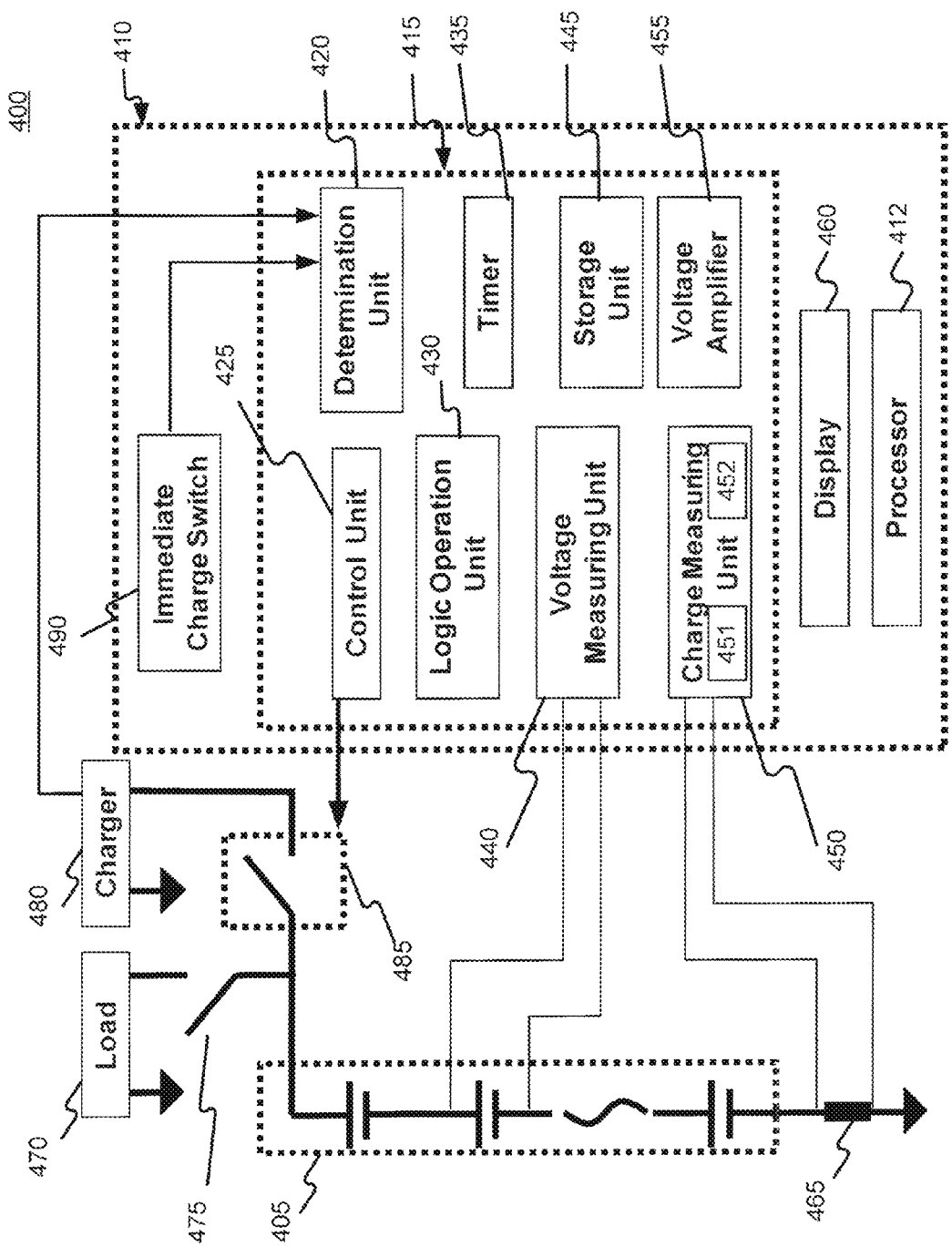
FIG. 4 illustrates an exemplary system for estimating a capacity of a battery consistent with a disclosed embodiment.

FIG. 4 illustrates an exemplary system 400 for estimating the capacity (remaining and/or discharge capacity) of a battery 405. The term "battery" as used herein may refer to a single battery (or battery cell) or a battery pack or assembly including one or more batteries (or battery cells). System 400 may include hardware and/or software components configured to perform the methods described below for estimating the capacity of battery 405. Although not shown in FIG. 4, it is understood that devices included in system 400 may be connected to one another and may transmit signals to or receive signals from one another.

Battery 405 may include one or more battery cells connected in series with one another. System 400 includes a capacity estimation apparatus 410. Capacity estimation apparatus 410 includes a processor 412. Processor 412 may have computing capabilities to perform various computations and to process various data and/or signals. Capacity estimation apparatus 410 includes a microcontroller 415. In some embodiments, processor 412 may be part of microcontroller 415. Microcontroller 415 includes a determination unit 420. Determination unit 420 may include hardware and/or software components for making determinations, e.g., whether certain conditions are satisfied, and performing mathematical calculations to determine values of, e.g., voltage, charge, errors. For example, determination unit 420 may include a processor having computing capabilities configured to perform various computations.

Microcontroller 415 includes a control unit 425. Control unit 425 may include hardware and/or software components for generating control signals and for transmitting the control signals to other devices, e.g., a first switch 475 and a second switch 485. Control unit 425 may also receive signals from other devices, such as a timer 435.

Microcontroller 415 also includes a logic operation unit 430. Logic operation unit 430 may include hardware and/or software components configured to perform logic operations, such as AND, and OR operations. Logic operation unit 430 transmits signals to other devices, such as control unit 425 and determination unit 420, and receives signals from other devices, such as a voltage signal from a voltage measuring unit 440.

Microcontroller 415 also includes timer 435 that counts how much time has elapsed since a starting point. For example, timer 435 may count how many minutes have elapsed since battery 405 is left at rest, which may be used by determination unit 420 to determine whether battery 405 has reached an idling state. Timer 435 receives signals from and transmits signals to other devices. For example, timer 435 may receive control signals from control unit 425, and/or may transmit time signals to control unit 425.

Microcontroller 415 also includes voltage measuring unit 440. Voltage measuring unit 440 may be connected to the terminals of a battery cell of battery 405, as shown in FIG. 4. Although not shown in FIG. 4, voltage measuring unit 440 may be connected to the terminals of more than one battery cell of battery 405. Voltage measuring unit 440 may include hardware (e.g., integrated-circuit chips) and/or software (e.g., program codes) configured to measure the OCV of a battery cell or cells after battery 405 has reached an idling state. It is understood that in the idling state, battery 405 is left at rest without any load being applied to its terminals. Only voltage measuring unit 440 may be connected to the terminals or cells of battery 405 for measuring the OCV.

Microcontroller 415 also includes a storage unit 445 configured to store data, such as look-up tables storing data pairs of voltage versus capacity, the measured OCV, the time counted by timer 435, results of the logic operations performed by logic operation unit 430, and results of the determination performed by determination unit 420. Storage unit 445 may also store program codes that when executed, e.g., by a processor of determination unit 420, perform one or more methods described herein. Storage unit 445 may include any suitable nontransitory computer-readable storage media, for example, memories such as random access memories (RAMs), read-only memories (ROMs), flash memories, hard drives, compact-discs (CDs), digital video discs (DVDs), and Blu-ray discs.

Microcontroller 415 also includes a charge measuring unit 450. Charge measuring unit 450 may be configured to measure an electric current flowing through battery 405. System 400 includes a resistive element 465 (e.g., a resistor) connected in series with battery 405. Charge measuring unit 450 is connected across terminals of resistive element 465 to enable measurement of current flowing through resistive element 465 (which may also be the current flowing through battery 405). Charge measuring unit 450 may include a coulomb counting device or circuit configured to count or calculate the amount of charge that has been discharged during a discharging process or with which battery 405 is charged during a charging process, for example, based on an integration of the measured current flowing through resistive element 465. Charge measuring unit 450 may continuously count the amount of charge discharged or charged when battery 405 is under a discharging process or charging process.

Charge measuring unit 450 may include a first charge measuring unit 451 for measuring the amount of charge (e.g., counting the amount of coulombs) during a discharging process, and a second charge measuring unit 452 for measuring the amount of charge (e.g., counting the amount of coulombs) during a charging process. For example, during a discharging process, first charge measuring unit 451 may measure the amount of charge that is discharged. In some applications, during a discharging process, battery 405 may also be under a charging process for relatively short time periods, and second charge measuring unit 452 may measure the amount of charge with which battery 405 is charged. In computing the net amount of charge that is discharged, system 400 may take into consideration both the amount of charge measured by first charge measuring unit 451 during the discharging process and the amount of charge measured by second charge measuring unit 452 during the charging process. For example, when a vehicle at least partially powered by battery 405 is being driven, battery 405 is under a discharging process. First charge measuring unit 451 measures the amount of charge that is discharged. However, when the vehicle is driven, there may be certain short time periods when brakes are applied, e.g., to stop or reduce the speed of the vehicle, which may in turn charge battery 405 during the braking periods. Under such circumstances, second charge measuring unit 452 measures the amount of charge with which battery 405 is charged. In computing the net charge being discharged while the vehicle is driven, system 400 deducts the amount measured by second charge measuring unit 452 from the amount measured by first charge measuring unit 451.

Figure 1:
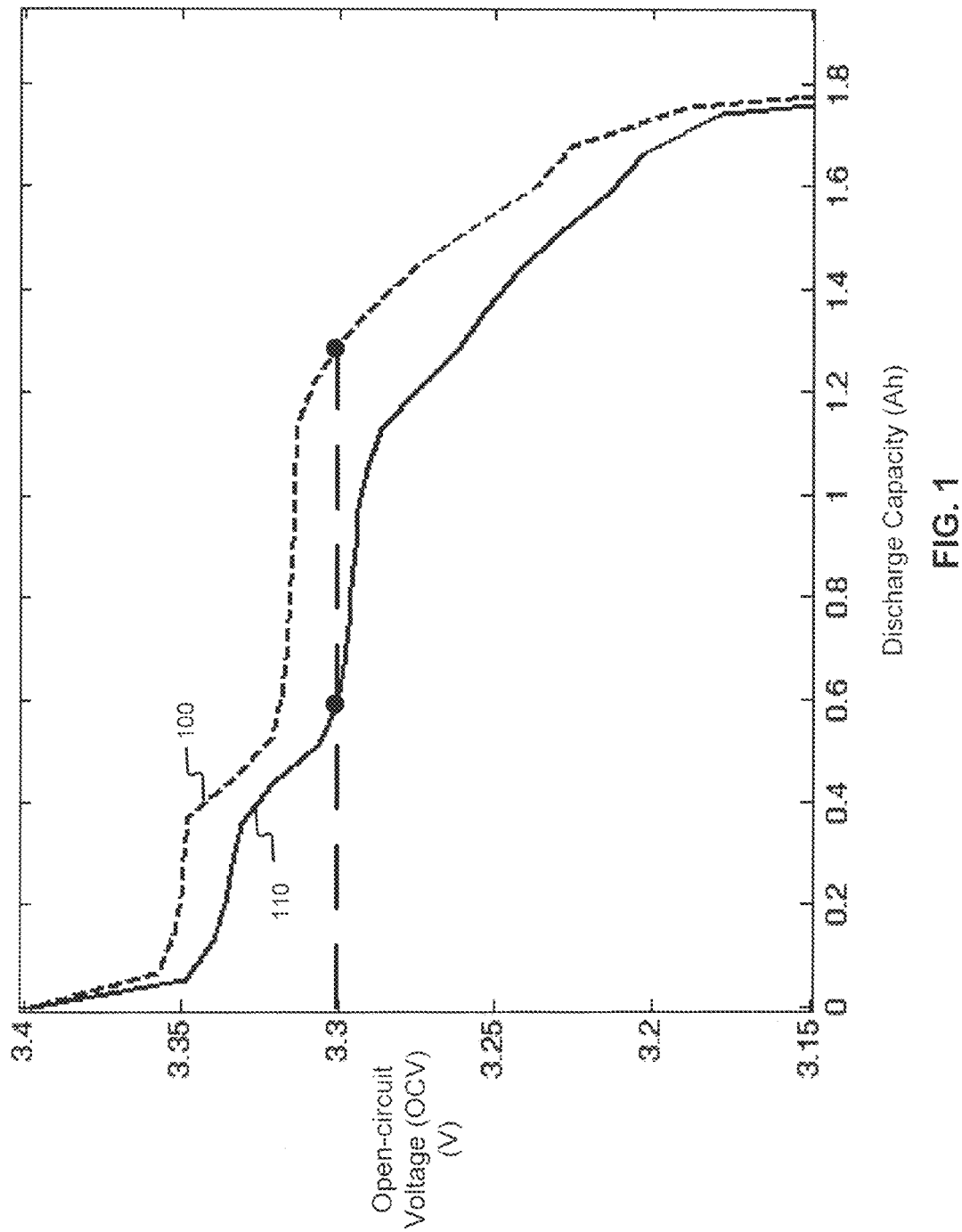
FIG. 1 illustrates exemplary voltage-capacity characteristic curves of a battery.
Figure 2:
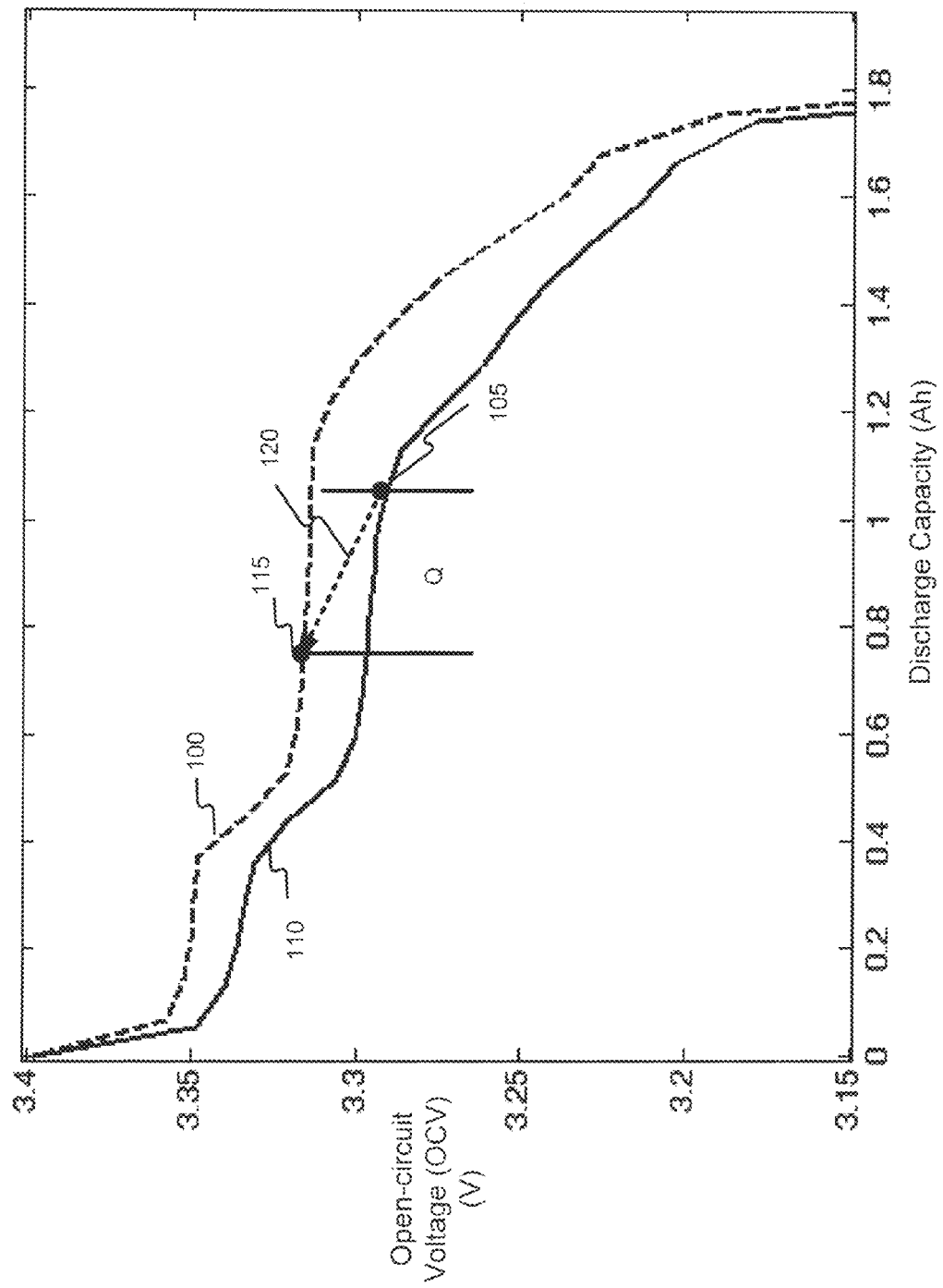
FIG. 2 illustrates an exemplary transition state of a battery.
Figure 3:
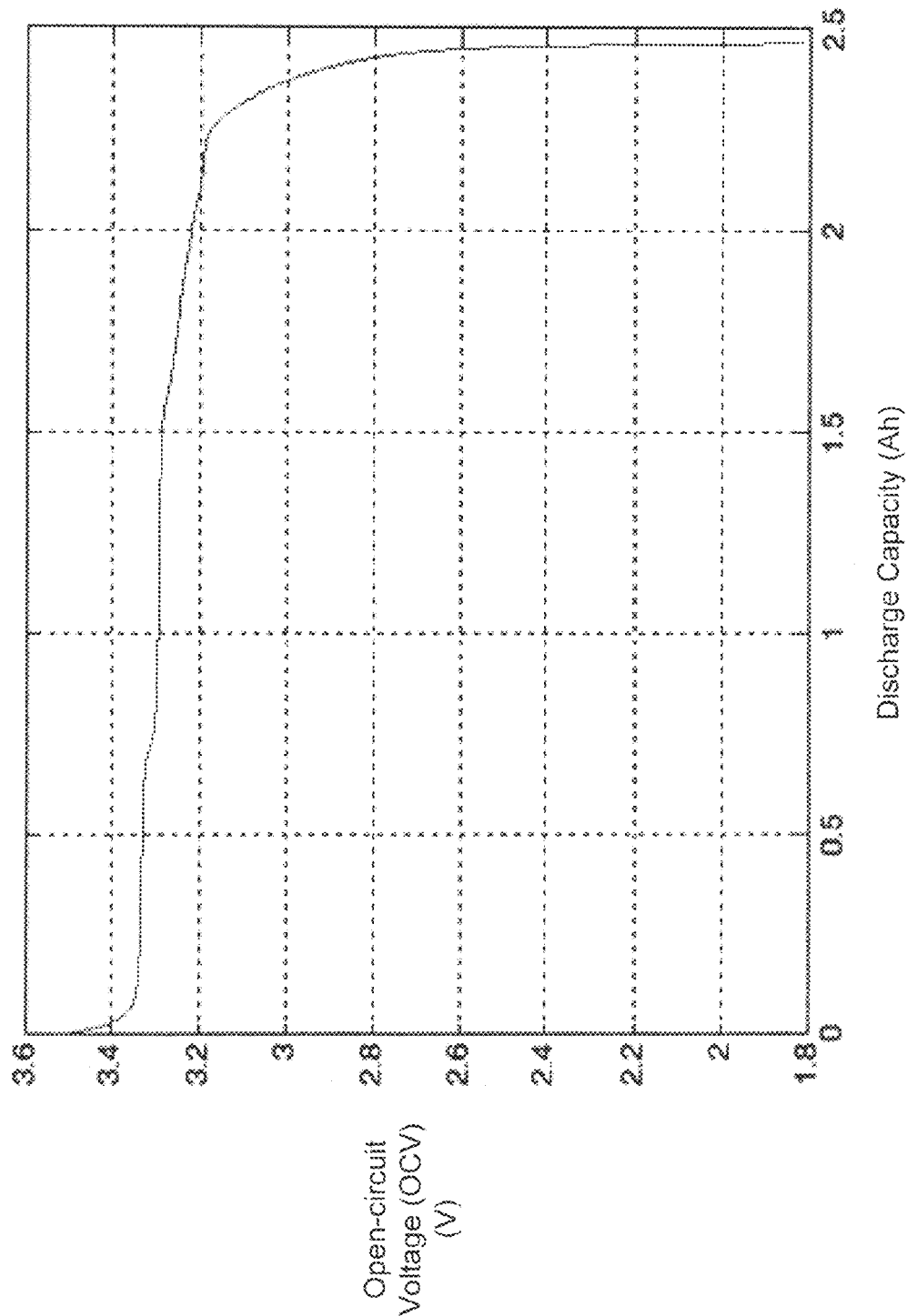
FIG. 3 illustrates an exemplary voltage-capacity characteristic curve of a battery.

Microcontroller 415 also includes a voltage amplifier 455 connected with voltage measuring unit 440 to receive a voltage signal from voltage measuring unit 440 and amplify the voltage signal. Voltage amplifier 455 outputs an amplified voltage signal, which is used in a look-up table correction process to improve accuracy. For example, referring to FIG. 1, around OCV=3.3V, the slope of discharge characteristic curve 110 is relatively flat, which means high resolution in OCV may be required to achieve an accurate estimate of the discharge capacity or remaining capacity. Around this OCV, voltage amplifier 455 is used to amplify the measured OCV, and the amplified OCV is used in the look-up table correction process. Use of the amplified OCV may improve the accuracy of the look-up table correction process. System 400 also includes a display 460, which may display various information about battery 405, such as the remaining capacity, the degradation capacity, the discharge capacity, the maximum capacity, voltage, time, and current.

For illustrative purposes, a load 470 is connected with battery 405 through first switch 475. Load 470 may include any suitable electric devices that consume electric charge of battery 405. For example, load 470 may include a battery configured to receive a certain amount of charge discharged from battery 405. Load 470 may include any suitable energy dissipating (e.g., consuming) devices such as a resistive component (e.g., a resistor), or any suitable energy storage devices, such as an auxiliary battery or a super-capacitor configured to receive and store a certain amount of charge discharged from battery 405. For example, when system 400 is implemented in an electric or a hybrid (including electricity as a partial power source) vehicle, load 470 may be an electric fan, a motor, a lighting device, etc. First switch 475 may be controlled by control unit 425 such that a predetermined amount of charge of battery 405 is consumed by load 470. For example, control unit 425 may use time information provided by timer 435 to control (e.g., open and/or close) first switch 475 such that a certain amount of charge of battery 405 is consumed by load 470.

System 400 optionally includes a charger 480 connected with battery 405 via second switch 485. Charger 480 charges battery 405 when second switch 485 is closed and charger 480 is energized. Second switch 485 is controlled by control unit 425. For example, when system 400 is implemented in an electricity-powered vehicle, and when the vehicle is parked with a power cord plugged into a power outlet, control unit 425 may transmit a control signal to close second switch 485, thereby connecting charger 480 with battery 405 in order to charge battery 405. When system 400 detects that battery 405 has been or will be overcharged, control unit 425 generates a control signal to open second switch 485. It is understood that although FIG. 4 illustrates that load 470, first switch 475, charger 480, and second switch 485 are located outside of capacity estimation apparatus 410, one or more of them may also be included in capacity estimation apparatus 410.

In some embodiments, charger 480 is connected to determination unit 420, as shown in FIG. 4. Charger 480 sends a signal (referred hereafter as "a charger connecting signal") to determination unit 420 indicating whether charger 480 is connected or disconnected, e.g., to or from a power outlet. Determination unit 420 determines the status of charger 480 based on the charger connecting signal. When the charger connecting signal indicates that charger 480 is connected to a power outlet, determination unit 420 sends a signal to control unit 425, which in turn generates a control signal to close second switch 485. When the charger connecting signal indicates that charger 480 is disconnected, determination unit 420 sends a signal to control unit 425, which in turn generates a control signal to open second switch 485. In some embodiments, if the charger connecting signal indicates that charger 480 is not connected to a power outlet, then whenever battery 405 is charged for a short amount of time, system 400 determines that the short charging process is due to charging mechanisms, such as charging by braking, as discussed above in an electric vehicle application.

System 400 also optionally includes an immediate charge switch 490, which may be a button operable on display 460 or a physical switch. Immediate charge switch 490 may include hardware and/or software component to receive a user's input indicating the user's desire to immediately charge battery 405 without waiting for battery 405 to reach an idling state (e.g., without waiting for 20 minutes after battery 405 is left at rest). Immediate charge switch 490 is connected with and transmits a signal to determination unit 420 indicating the user's desire to immediately charge battery 405. Determination unit 420 determines whether or not to allow immediate charging based on the signal received from immediate charge switch 490 and information received from other devices, such as timer 435, voltage measuring unit 440, and charge measuring unit 450.

Figure 5:
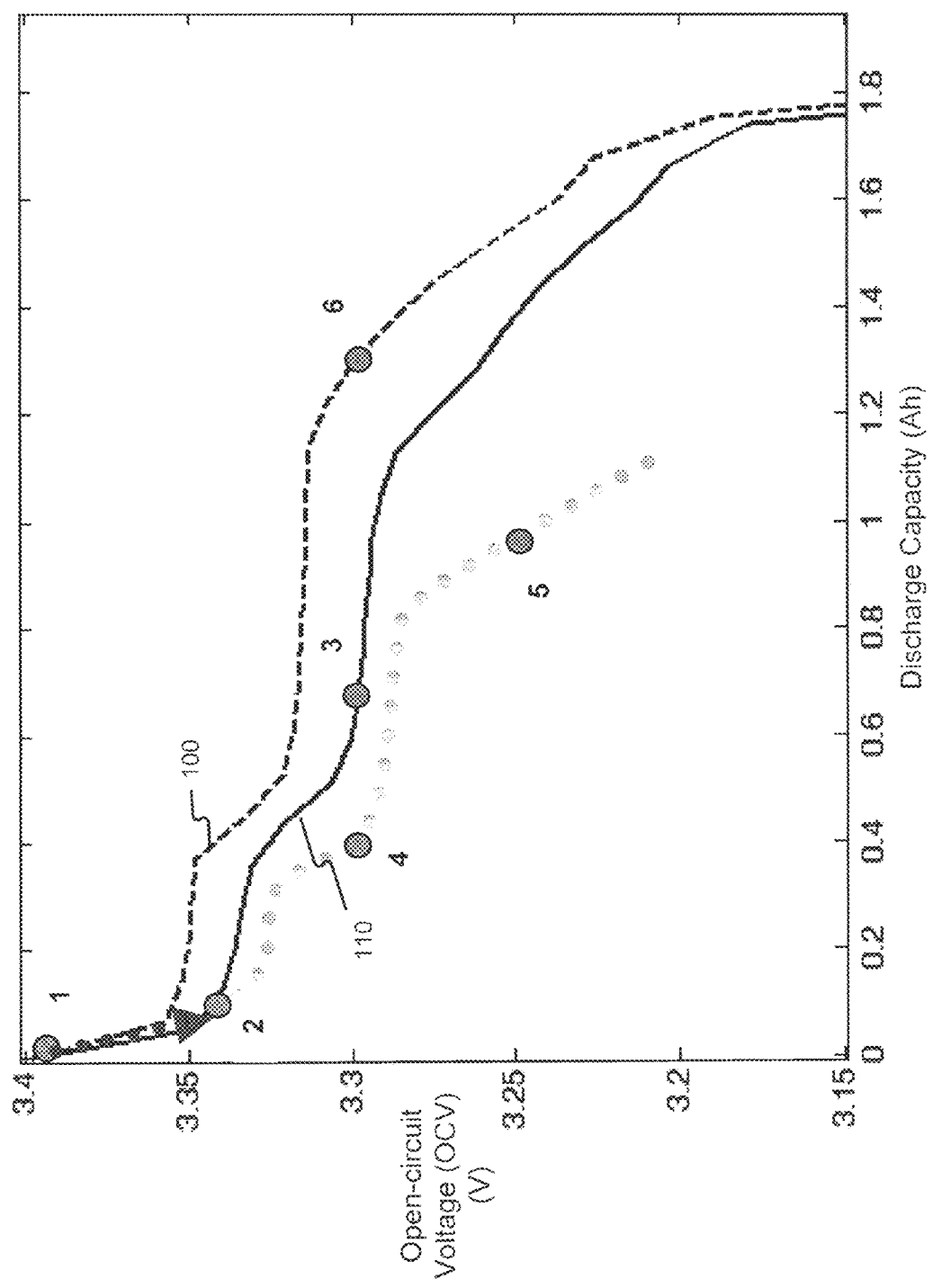
FIG. 5 illustrates an exemplary method for estimating a capacity of a battery consistent with a disclosed embodiment.

FIG. 5 illustrates an exemplary method for estimating the capacity of a battery. The method includes an initialization process performed before the battery is discharged for correcting the look-up table. According to one embodiment, the initialization process includes a pre-discharge process. FIG. 5 shows the charge-mode and discharge-mode characteristic curves 100 and 110, which represent the relationship between the OCV and the discharge capacity. Look-up tables may be provided for storing data derived from the characteristic curves. When battery 405 is in an idling state, an OCV is measured by voltage measuring unit 440, and the discharge capacity of battery 405 is estimated from the look-up table corresponding to the characteristic curves. For descriptive purposes, the discharge-mode characteristic curve (and its corresponding look-up table) is used in estimating the discharge capacity (and the remaining capacity) for a measured OCV. It is understood that the charge-mode characteristic curve (and its corresponding look-up table) may also be used in estimating the discharge capacity (and the remaining capacity) for a measured OCV.

In some situations, it may be difficult to determine which characteristic curve should be used to estimate the discharge capacity corresponding to a measured OCV. For example, a measured OCV of 3.29 V may correspond to point 3 on discharge-mode characteristic curve 110, point 6 on charge-mode characteristic curve 100, or any point on a horizontal line at the level of 3.29 V including point 3 and point 6. As a result, it may be difficult to accurately determine the discharge capacity (and thus the remaining capacity) at that point. To overcome the problem, according to one embodiment, when the battery status is unknown, uncertain, or when it is necessary to bring battery 405 into a state where discharge-mode characteristic curve 110 may be applied to estimate the capacity, system 400 initializes battery 405, e.g., by discharging battery 405 by a certain amount of charge to reach a point referred to herein as an initialization state or an initialization point. For example, at point 1, system 400 may pre-discharge battery 405 by a certain amount to bring battery 405 into an initialization state at point 2. At the initialization state, system 400 determines that discharge-mode characteristic curve 110 (and its corresponding look-up table) may be applied to accurately estimate the discharge capacity. This discharging process is referred to as a pre-discharging (or pre-discharge) process, which is a first discharging process performed prior to a second discharging process (e.g., from point 2 to point 4) that is performed for correcting the look-up table. The initialization state at the end of the pre-discharging process may serve as a starting point for the second discharging process, e.g., the initialization state at point 2 may serve as the starting point for the second discharging process from point 2 to point 4.

In another embodiment described below in connection with FIGS. 7-9, system 400 charges battery 405 until it reaches an initialization state where a predetermined charging termination condition is satisfied, e.g., when charging voltage and/or current have reached a predetermined value. The initialization state may serve as a starting point for a discharging process used for correcting the look-up table.

Still referring to FIG. 5, if battery 405 is in a state at point 3 or point 6, an initialization process may be performed by system 400 to bring battery 405 into an initialization state where discharge-mode characteristic curve 110 may be applied in estimating the capacity. In some embodiments, if battery 405 is not in a charging state, system 400 may wait until battery 405 enters a charging state before performing the pre-discharge process, or may charge battery 405 to a state where a predetermined charging termination condition is satisfied before performing the pre-discharge process. For illustrative purposes, it is assumed that battery 405 is in a state indicated by point 1, where a predetermined charging termination condition is satisfied.

The predetermined charging termination condition may be defined as when the OCV of battery 405 is greater than a predetermined value. For example, the predetermined charging termination condition may be satisfied when the OCV is greater than 3.35 V. The predetermined charging termination condition may also be defined as when the discharge capacity of battery 405 is smaller than a predetermined value, e.g., 0.2 Ah. The predetermined charging termination condition may also be defined as when battery 405 is fully charged or is in a state that is close to a fully charged state (e.g., OCV>3.35 V, and discharge capacity <0.2 Ah). For example, system 400 may terminate the charging process when battery 405 reaches point 1, which corresponds to about 3.4 V and less than 0.1 Ah. Other exemplary predetermined charging termination conditions described below in connection with FIGS. 7-9 may also be applied in the embodiment shown in FIG. 5.

At point 1, system 400 performs an initialization process, which may include a pre-discharge process to pre-discharge battery 405 by a suitable amount of charge or capacity $Q_{dis}$ until battery 405 reaches point 2, at which state system 400 determines that discharge-mode characteristic curve 110 (and its look-up table) is suitable for determining the discharge capacity corresponding to a measured OCV. The amount of charge $Q_{dis}$ pre-discharged between point 1 and point 2 during the pre-discharge process may be predetermined to be, for example, 3-5% of fully charged capacity, or may be arbitrary. In one embodiment, it may be determined that a suitable amount of $Q_{dis}$ has been discharged when the battery has been discharged, e.g., for a certain amount of time, such as 10 minutes. In another embodiment, system 400 may continuously discharge battery 405, and may measure the discharged amount of charge $Q_{dis}$, e.g., by charge measuring unit 450. When system 400 determines that the measured $Q_{dis}$ is greater than a predetermined value (e.g., 0.5 Ah), system 400 terminates the pre-discharge process. The pre-discharge process is performed by closing first switch 475 to connect load 470 to battery 405. Load 470 consumes energy from battery 405, thereby causing battery 405 to discharge. Control unit 425 controls first switch 475 such that a predetermined amount of charge is consumed by load 470.

At point 2, the OCV may be measured by voltage measuring unit 440, and the corresponding discharge capacity may be determined from the look-up table corresponding to the discharge-mode characteristic curve 110. For descriptive purposes, the discharge capacity determined from the look-up table is referred to as an initial charge or capacity $Q_{init}$. From point 2, system 400 further discharges battery 405 under a normal condition until it reaches point 4. This discharging process from point 2 to point 4 is used for correcting the look-up table. This discharging process may be arbitrary or random (e.g., point 4 may be an arbitrary or random point), which means that the amount of charge or capacity $Q_1$ discharged from point 2 to point 4 may be arbitrary or random. For example, the discharging may take place for 20 minutes, 30 minutes, etc., to reach point 4. In some embodiments, the amount of charge $Q_1$ discharged from point 2 to point 4 may be predetermined. For example, $Q_1$ may be greater than a predetermined amount, for example, 3% of full capacity. System 400 may continuously discharge battery 405 starting from point 2, and may continuously measure and/or calculate the accumulated actual discharge or charge capacity $Q_{real}$ (for illustrative purposes, $Q_{real}$ is herein referred to as discharge capacity although it may also represent the charge capacity) using charge measuring unit 450, which may include a coulomb counting device known in the art. System 400 terminates the discharging process when $Q_{real}$ reaches a predetermined amount. The discharging process is performed by closing first switch 475 to connect load 470 to battery 405. Load 470 consumes energy from battery 405, thereby discharging battery 405.

Point 4 may or may not fall on the discharge-mode characteristic curve 110. At point 4, the actual discharge capacity $Q_{real}$ (also referred to as "actual capacity $Q_{real}$") may be determined from $Q_{real}=Q_1+Q_{init}$. When battery 405 is at a state corresponding to point 4, it may be left at rest for a certain amount of time (e.g., 20 minutes) until it reaches an idling state. The open-circuit voltage (OCV) is measured by voltage measuring unit 440 to be, e.g., $V_4$. A corresponding discharge capacity is estimated from the look-up table corresponding to discharge-mode characteristic curve 110. Assuming the discharge capacity estimated using the look-up table is $Q_{table}$ (referred to as "look-up capacity $Q_{table}$" or "look-up charge $Q_{table}$" hereafter) corresponding to OCV=$V_4$, a difference between the actual capacity $Q_{real}$ and the look-up capacity $Q_{table}$ is determined as $dAh=Q_{real}-Q_{table}$.

If $|dAh|>Q_{set1}$, where $||$ denotes the absolute value operation, and $Q_{set1}$ is a predetermined amount, a look-up table correction process is performed. $Q_{set1}$ may be any suitable value. For example, $Q_{set1}$ may be at least 5% of the fully charged capacity. The look-up table correction process is not performed unless PAN is greater than $Q_{set1}$. For example, if $Q_{set1}$ is 0.2 Ah and dAh is 0.25 Ah, or –0.25 Ah, a look-up table correction process is performed. The look-up table correction process includes a first process to correct the characteristic curves, such as discharge-mode characteristic curve 110, and a second process for correcting (e.g., updating) the corresponding look-up table with new data from the corrected characteristic curves. The first process and second process may be a single process, in which data included in the look-up table is corrected directly. The updated look-up table may be used for subsequent estimation of the remaining capacity. For example, when the battery continues to discharge from point 4 until it reaches a point 5, based on the measured OCV (e.g., $V_5$) at point 5, the discharge capacity (and therefore the remaining capacity) can be determined more accurately using the corrected (e.g., updated) look-up table. System 400 may also calculate the degradation capacity of battery 405. The degradation capacity $Q_{deg}$ is calculated from $Q_{deg}=Q_{fresh}-Q_{max}$, where $Q_{fresh}$ is the nominal maximum capacity of battery 405 when battery 405 is new, and $Q_{max}$ is the maximum capacity of battery 405 according to the look-up table. System 400 displays both the degradation capacity and the remaining capacity on display 460.

Figure 6:
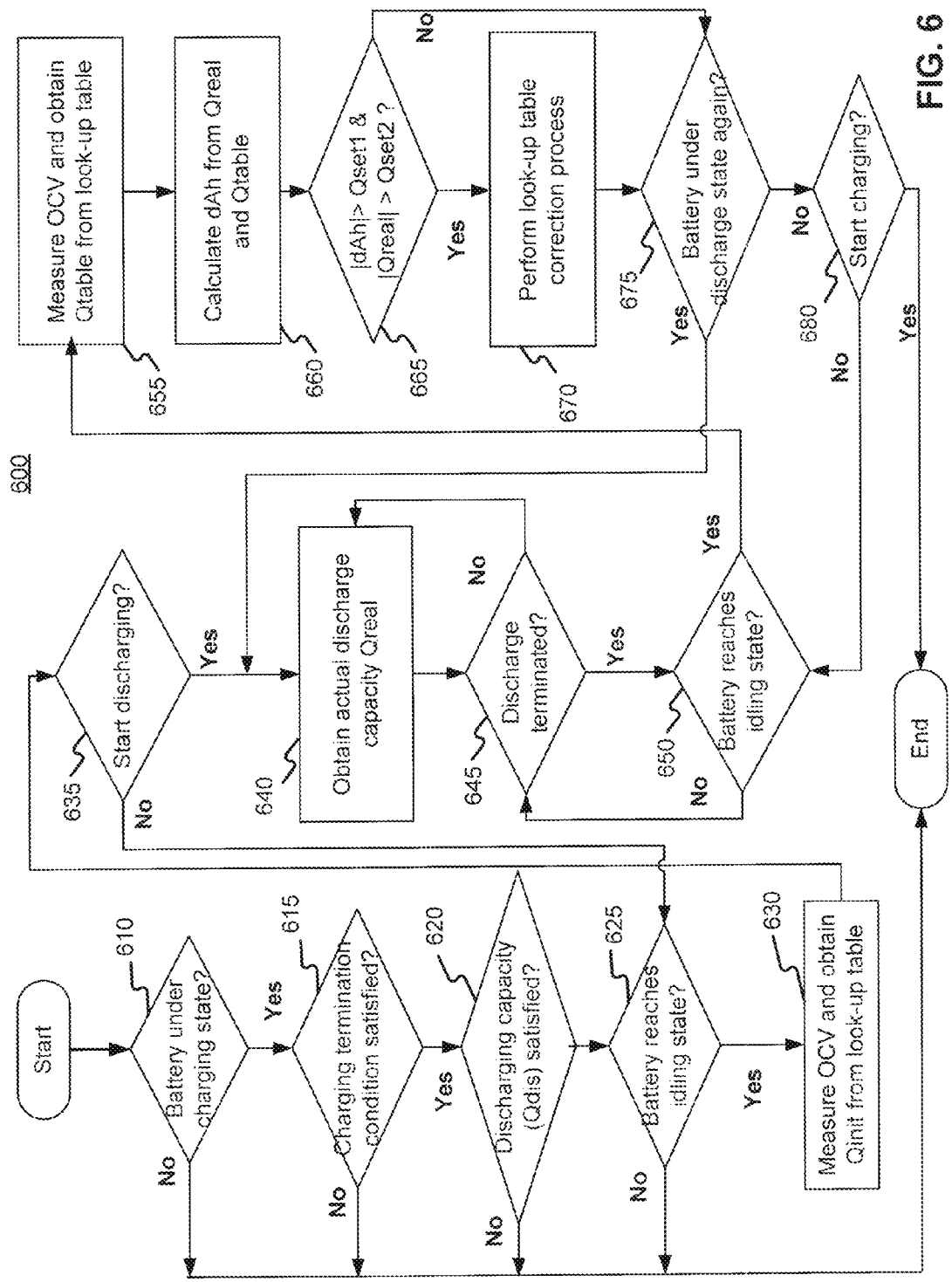
FIG. 6 illustrates a flowchart showing a process corresponding to the exemplary method shown in FIG. 5.

FIG. 6 illustrates an exemplary flowchart of a process 600 corresponding to the method described above in connection with FIG. 5 for estimating the remaining capacity and/or the degradation capacity of a battery. System 400 may perform process 600 at a predetermined interval of time to determine whether criteria for triggering a look-up table correction process have been satisfied, or to determine a current state of process 600. Process 600 includes processes for determining whether to correct a look-up table corresponding to the discharge-mode characteristic curve and/or the charge-mode characteristic curve, and processes for correcting the look-up table. Process 600 includes an initialization process that may include a pre-discharge process. Process 600 may be performed by system 400, e.g., by capacity estimation apparatus 410, until it is prevented from being performed. Process 600 may also be terminated at any step shown in FIG. 6.

In step 610, system 400 determines whether battery 405 is under a charging state (i.e., whether battery 405 is being charged). This determination is performed by a suitable device of system 400, e.g., microcontroller 415. For example, determination unit 420 of microcontroller 415 receives a signal from second switch 485, and determines the status of second switch 485, thereby determining whether battery 405 is being charged by charger 480. In some embodiments, system 400 may wait until battery 405 is under a charging state, or may start a charging process so that battery 405 is placed under a charging state. If battery 405 is not under a charging state (No, step 610), a process of correcting the characteristic curves, such as discharge-mode characteristic curve 110, and the corresponding process of updating the corresponding look-up table, will not be performed, and system 400 terminates process 600. Although the correcting process is not performed at this time, system 400 may still use discharge-mode characteristic curve 110 and its corresponding look-up table and the actual capacity measured by charge measuring unit 450 to calculate the discharge capacity and/or the remaining capacity and degradation capacity, which may be displayed to the user on display 460. The details about displaying the discharge capacity and/or the remaining capacity are discussed below in connection with FIG. 15.

After determining that battery 405 is under a charging state (Yes, step 610), system 400 determines, for example, through determination unit 420, whether a predetermined charging termination condition has been satisfied (step 615). The charging termination condition includes, for example, whether battery 405 has been in a state where the OCV is greater than a predetermined value (e.g., 3.35 V). The charging termination condition may include whether battery 405 has been charged to a state that is either a fully charged state, or close to the fully charged state, as described above in connection with FIG. 5. For example, when battery 405 has been charged to point 1 shown in FIG. 5, system 400 determines that charging termination condition has been satisfied (e.g., OCV at point 1 is greater than a predetermined value, and discharge capacity at point 1 is smaller than a predetermined value). System 400 terminates the charging process, for example, by opening second switch 485. If system 400 determines that the charging termination condition has not been satisfied (No, step 615), system 400 terminates process 600. In other words, if system 400 determines that the charging termination condition has not been satisfied (No, step 615), a look-up table correction process will not be performed.

If system 400 determines that the charging termination condition has been satisfied (Yes, step 615), system 400 performs an initialization process which includes a pre-discharge process. System 400 initializes battery 405 by pre-discharging battery 405, for example, from point 1 to point 2 (as shown in FIG. 5), and determines whether a predetermined amount of charge $Q_{dis}$ has been discharged (step 620). As described above in connection with FIG. 5, $Q_{dis}$ may be any suitable predetermined value, so long as at point 2, it can be determined with sufficient certainty that discharge-mode characteristic curve 110 is suitable for determining the discharge capacity (and thus the remaining capacity) at point 2.

At point 2 of FIG. 5, battery 405 is left at rest for a certain amount of time, and system 400 determines, e.g., via determination unit 420, whether battery 405 has reached an idling state (step 625). If system 400 determines that battery 405 has not reached the idling state (No, step 625), system 400 terminates process 600 and a look-up table correction process will not be performed. If system 400 determines that battery 405 has reached the idling state (Yes, step 625), system 400 measures, e.g., via voltage measuring unit 440, the open-circuit voltage (OCV) of battery 405 at point 2 (step 630). The measured OCV is stored in storage unit 445. System 400 obtains a discharge capacity $Q_{init}$ corresponding to the measured OCV at point 2 from the look-up table corresponding to discharge-mode characteristic curve 110.

System 400 determines whether battery 405 has started a discharging process (step 635). If system 400 determines that battery 405 has not started discharging (No, step 635), system 400 repeats step 625. If system 400 determines that battery 405 has started discharging (Yes, step 635), system 400 discharges battery 405 and obtains (e.g., by measuring) the real or actual discharge capacity $Q_{real}$ using, e.g., second charge measuring unit 452 included in charge measuring unit 450 (step 640). For example, second charge measuring unit 452 may include a coulomb counting device that continuously calculates or counts the total amount of charge $Q_1$ that has been discharged since the discharge process is started from point 2. System 400 calculates the actual discharge capacity $Q_{real}$ from $Q_{real}=Q_1+Q_{init}$. Based on the actual discharge capacity, system 400 also determines the actual remaining capacity $A_{real}$ from (maximum capacity−actual discharge capacity $Q_{real}$). In some embodiments, during a discharge process, battery 405 may be charged in short time periods. For example, when a vehicle powered by battery 405 is being driven, battery 405 is under a discharge process. However, occasional braking may also charge battery 405. In such circumstances, first charge measuring unit 451 measures an amount of charge $Q_{ch}$ with which battery 405 is charged, and system 400 determines $Q_{real}$ from $Q_{real}=Q_1+Q_{init}-Q_{ch}$.

System 400 determines, e.g., via determination unit 420, whether the discharging process has been terminated (step 645). If the discharging process has not been terminated (No, step 645), system 400 repeats the determination performed at step 645. If system 400 determines that the discharging process has been terminated (Yes, step 645), e.g., battery 405 has reached point 4 in FIG. 5, system 400 determines whether battery 405 has reached the idling state (step 650). Criteria for determining whether battery 405 has reached the idling state may include, for example, whether battery 405 has been left at rest for more than a certain amount of time, such as 20 minutes. If system 400 determines that battery 405 has not reached the idling state (No, step 650), system 400 repeats step 645. Alternatively, if system 400 determines that battery 405 has not reached the idling state (No, step 650), process 600 repeats step 650 until battery 405 has reached the idling state (Yes, step 650).

If system 400 determines that battery 405 has reached the idling state (Yes, step 650), system 400 measures the OCV of battery 405, for example, using voltage measuring unit 440 (step 655). Based on the measured OCV, system 400 estimates, e.g., via processor 412, the discharge capacity $Q_{table}$ from a look-up table corresponding to the discharge-mode characteristic curve 110. In step 660, system 400 calculates, e.g., via processor 412, an error or difference dAh between the actual discharge capacity $Q_{real}$ and the capacity $Q_{table}$ obtained using the measured OCV and the look-up table: $dAh=Q_{real}-Q_{table}$.

System 400 determines in step 665, e.g., via determination unit 420, whether |dAh| is greater than $Q_{set1}$, and whether |$Q_{real}$| is greater than a predetermined discharge amount $Q_{set2}$. $Q_{set2}$ may be any suitable amount, for example, 10% of DOD (Depth of Discharge). For example, if the DOD of battery 405 is 2 Ah, 10% of DOD is 0.2 Ah. In other words, if the total amount of charge discharged from point 1 to point 4, which is |$Q_{real}$|, is not greater than $Q_{set2}$, system 400 may not perform a look-up table correction process, because if $Q_{real}$ is too small, the correction to the look-up table may not effectively improve the accuracy of the look-up table (and therefore the estimation of the remaining capacity) due to the existence of other errors.

If either of the two conditions (i.e., |dAh|>$Q_{set1}$ and |$Q_{real}$|>$Q_{set2}$) is not satisfied (No, step 665), system 400 skips step 670 and performs step 675 (i.e., system 400 does not perform a look-up table correction process in step 670). If both of the two conditions are satisfied (Yes, step 665), system 400 performs, e.g., via processor 412, a look-up table correction process (step 670), in which the look-up table is corrected (e.g., updated). Details of the look-up table correction process are described below in connection with FIGS. 10-12.

After performing the look-up table correction process in step 670, system 400 determines whether battery 405 is again under a discharge state (step 675). If system 400 determines that battery 405 is again under a discharge state (Yes, step 675), system 400 repeats step 640. If system 400 determines that battery 405 is not under a discharge state again (No, step 675), system 400 determines, e.g., via determination unit 420, whether a charging process should be started for battery 405 (step 680), for example, based on the charger connecting signal received from charger 480. If system 400 determines from the charger connecting signal that charger 480 is not connected to a power outlet, which indicates that a charging process should not be started for battery 405 (No, step 680), system 400 repeats step 650. If system 400 determines from the charger connecting signal that charger 480 is connected to a power outlet, which indicates that a charging process should be started for battery 405 (Yes, step 680), system 400 terminates process 600. After process 600 is terminated, system 400 may start charging battery 405 and restart process 600 by performing step 610.

Figure 7:
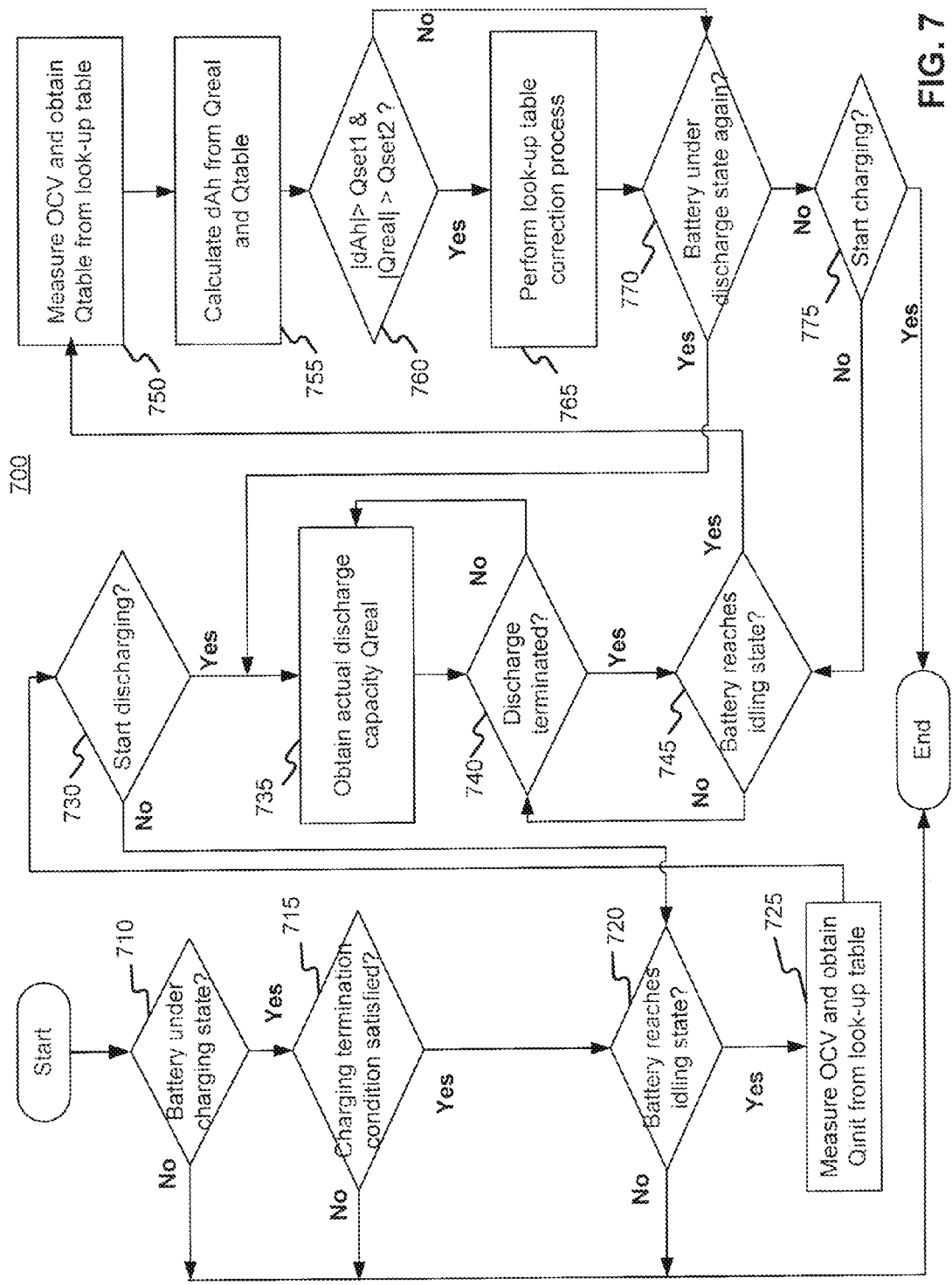
FIG. 7 illustrates a flowchart showing a process corresponding to an exemplary method for estimating a capacity of a battery consistent with the disclosed embodiments.

FIG. 7 illustrates a flowchart showing another exemplary process 700 for estimating the capacity of battery 405. Process 700 may include steps similar to those discussed above in connection with process 600 shown in FIG. 6. Compared to process 600 shown in FIG. 6, process 700 does not include a pre-discharge process (e.g., pre-discharge process 620). In addition, the charging termination condition used in step 715 may be the same as or different from those discussed above in connection with step 615. The charging termination condition discussed below in connection with step 715 may also be applied in step 615.

In process 700, system 400 determines, in step 710, whether battery 405 is under a charging state. If battery 405 is not under a charging state (No, step 710), system 400 terminates process 700. If battery 405 is under a charging state (Yes, step 710), while battery 405 is being charged, system 400 determines whether a predetermined charging termination condition has been satisfied (step 715). In step 715, system 400 performs an initialization process in which battery 405 is charged under a certain charging mode until battery 405 reaches an initialization state where a predetermined charging termination condition is satisfied. The initialization state serves as a starting point for a second discharging process described below for correcting the look-up table.

The predetermined charging termination condition may be defined such that battery 405 is charged to have a capacity greater than a predetermined value. The predetermined value may be a value close to a full capacity, e.g., SOC>90%. When the predetermined charging termination condition is satisfied, the charging process is terminated, and battery 405 is in a fully charged state or a state close to a fully charged state.

System 400 determines whether battery 405 has reached an idling state (step 720). If battery 405 has not reached the idling state (No, step 720), system 400 terminates process 700. If battery 405 has reached the idling state (Yes, step 720), system 400 measures an OCV, and obtains an initial discharge capacity $Q_{init}$ of battery 405 from the look-up table (step 725). System 400 determines whether battery 405 has started a discharging process (step 730). If battery 405 has not started a discharging process (No, step 730), system 400 repeats step 720. If battery 405 has started a discharging process (Yes, step 730), system 400 obtains, in step 735, the actual discharge capacity $Q_{real}$ in a manner similar to that described above in connection with FIG. 6. System 400 determines whether the discharging process has been terminated (step 740). If the discharging process has not been terminated (No, step 740), system 400 repeats step 735. If the discharging process has been terminated (Yes, step 740), system 400 determines whether battery 405 has reached an idling state (step 745). If battery 405 has not reached the idling state (No, step 745), system 400 repeats step 740. If battery 405 has reached the idling state (Yes, step 745), system 400 measures an OCV of battery 405 and obtains a look-up capacity $Q_{table}$ from the look-up table (step 750).

System 400 calculates, in step 755, a difference dAh between the actual discharge capacity $Q_{real}$ and the look-up capacity $Q_{table}$ based on dAh=$Q_{real}$-$Q_{table}$. System 400 then determines if both conditions of |dAh|>$Q_{set1}$ and |$Q_{real}$|>$Q_{set2}$ have been satisfied (step 760). If either one of the conditions has not been satisfied (No, step 760), system 400 performs step 770 to determine whether battery 405 is under a discharge state again. If both of the conditions have been satisfied (Yes, step 760), system 400 performs a look-up table correction process (step 765), which will be described in detail in connection with FIGS. 10-12. After performing the look-up table correction process, system 400 determines whether battery 405 is again under a discharge state (step 770). If battery 405 is again under a discharge state (Yes, step 770), system repeats step 735. If battery 405 is not under a discharge state again (No, step 770), system 400 determines, e.g., via determination unit 420, whether a charging process should be started for battery 405 (step 775), for example, based on the charger connecting signal received from charger 480. If system 400 determines that charger 480 is not connected to a power outlet, which indicates that a charging process should not be started for battery 405 (No, step 775), system 400 repeats step 745. If system 400 determines that charger 480 is connected to a power outlet, which indicates that a charging process should be started for battery 405 (Yes, step 775), system 400 terminates process 700. After terminating process 700, system 400 may start charging battery 405 and restart process 700 by performing step 710.

Figure 8A:
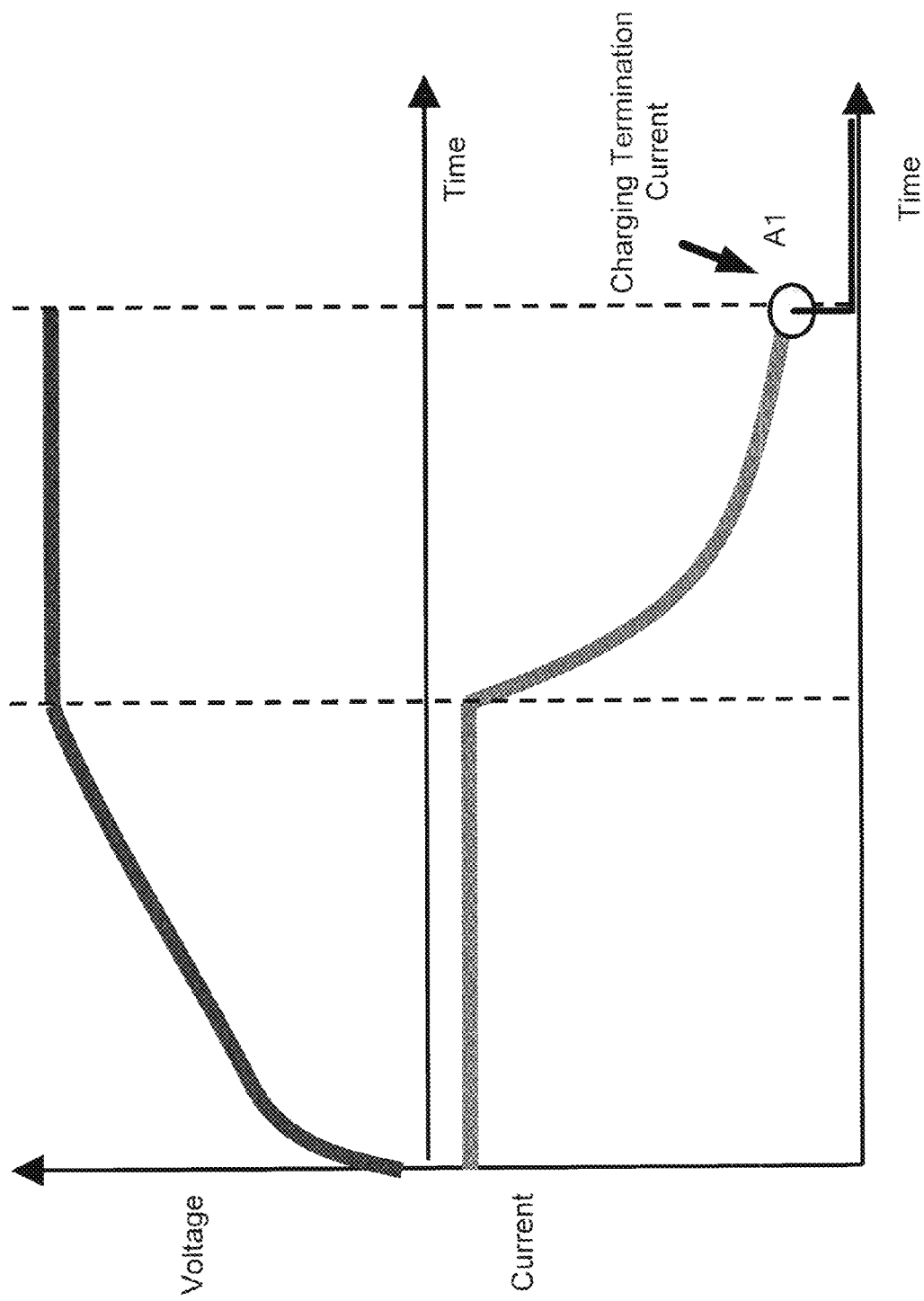
FIGS. 8A-8C illustrate exemplary charging termination conditions consistent with a disclosed embodiment.

Referring to step 715, the predetermined charging termination condition is defined as when a charging voltage of battery 405 is greater than a predetermined voltage and/or when a charging current is smaller than a predetermined charging termination current. FIG. 8A shows exemplary charging processes and charging termination conditions. A typical charging process may include two stages, as shown in FIG. 8A. In a first stage, battery 405 is charged under a constant charging current while the voltage of the battery is increased. After the voltage reaches a certain value (e.g., 3.6 V), a second stage is performed, in which battery 405 is charged under a constant charging voltage (e.g., 3.6 V, as indicated by the flat line in the voltage curve), while the current flowing through battery 405 is decreased. A point A1 on the current curve indicates the charging termination current at which the charging process is terminated. Current may be reduced to zero after point A1, as shown in FIG. 8A. When battery 405 is charged at a constant charging voltage, the predetermined charging termination condition is defined as when the current flowing through battery 405 has decreased to be smaller than the predetermined charging termination current. The predetermined charging termination current may be any suitable current. For example, the charging termination current may be 0.1 C, where C indicates the charging rate. Assuming that 1 C corresponds to a current of 1 A, which indicates that battery 405 is fully charged in one hour when the charging current is 1 Ampere (i.e., 1 A), then 0.1 C indicates a current of 0.1 A. The current flowing through battery 405 is measured by charge measuring unit 450.

The point at which charging is terminated is referred to herein as the initialization state, as described above in connection with FIGS. 5-7. At the initialization state, the discharge capacity is zero or close to zero, which means battery 405 is fully charged or close to be fully charged. The initialization state serves as a starting point for a subsequent discharging process for determining whether the look-up table should be corrected, and for correcting the look-up table, if needed.

Figure 8B:
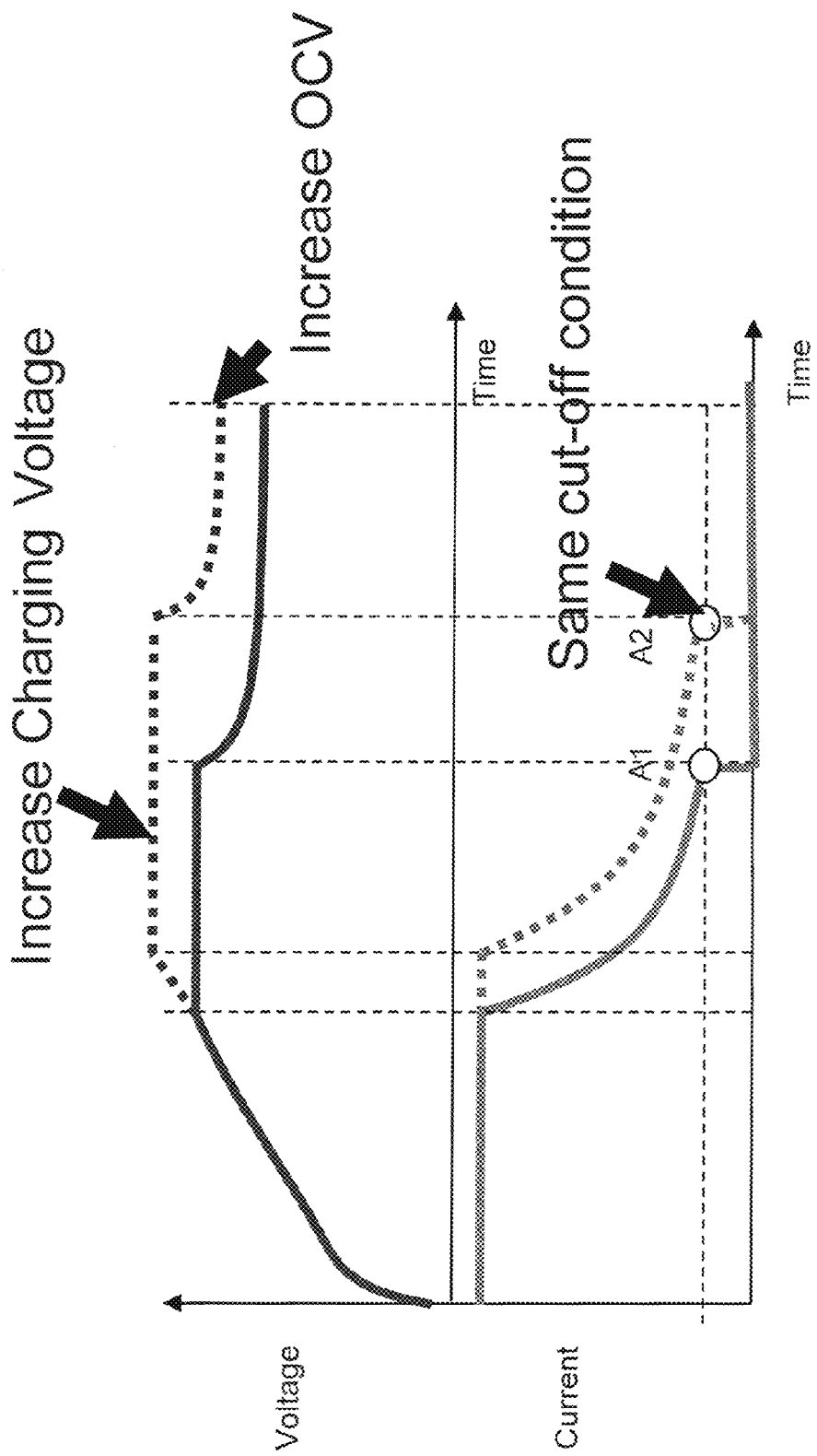

FIG. 8B illustrates exemplary methods that may be used to adjust the charging termination condition if, after battery 405 is charged using a previously set charging termination condition (e.g., 3.6 V and 0.1 C), the OCV value of battery 405 (measured after battery 405 has reached an idling state) does not reach a predetermined value (e.g., OCV<3.43 V). For example, system 400 may adjust the charging termination condition by increasing the charging voltage in the constant voltage charging process (shown in the dotted voltage curve in FIG. 8B), for example, from 3.6 V (used in a previous charging process) to 3.7 V, while maintaining the charging termination current, e.g., at 0.1 C (e.g., as indicated by points A1 and A2 on the same current level). As a result of increasing the constant charging voltage, the OCV of battery 405 measured after the charging process is terminated is increased, as illustrated by the dotted voltage curve beyond the time corresponding to point A2.

Figure 8C:
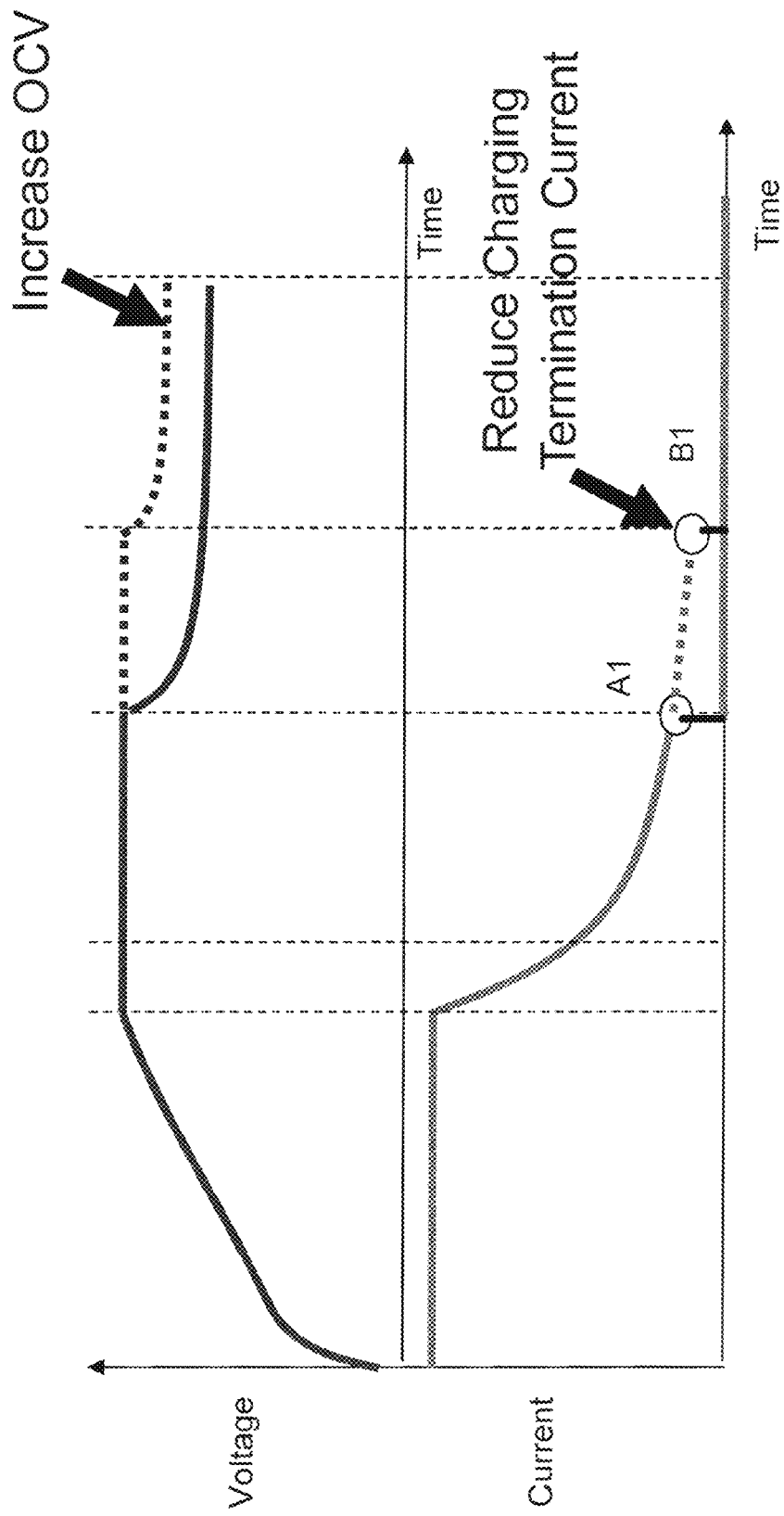

System 400 may also decrease the charging termination current, e.g., from 0.1 C to 0.07 C, while maintaining the charging voltage at, e.g., 3.6 V, as illustrated in FIG. 8C. For example, constant voltage charging may be terminated at point B1 instead of point A1. The current associated with point B1 is smaller than the current associated with point A1. During the time period from point A1 to point B1, battery 405 is charged under constant voltage. After point B1, the charging current may be reduced to zero, i.e., the charging process may be terminated. As a result of reducing the charging termination current, the OCV of battery 405 measured after the charging process is terminated is increased, as illustrated by the dotted voltage curve beyond the time corresponding to point B1. In some embodiments, system 400 may both increase the charging voltage (e.g., from 3.6 V to 3.7 V) and decrease the charging termination current (e.g., from 0.1 C to 0.07 C).

Figures 9A, 9B:
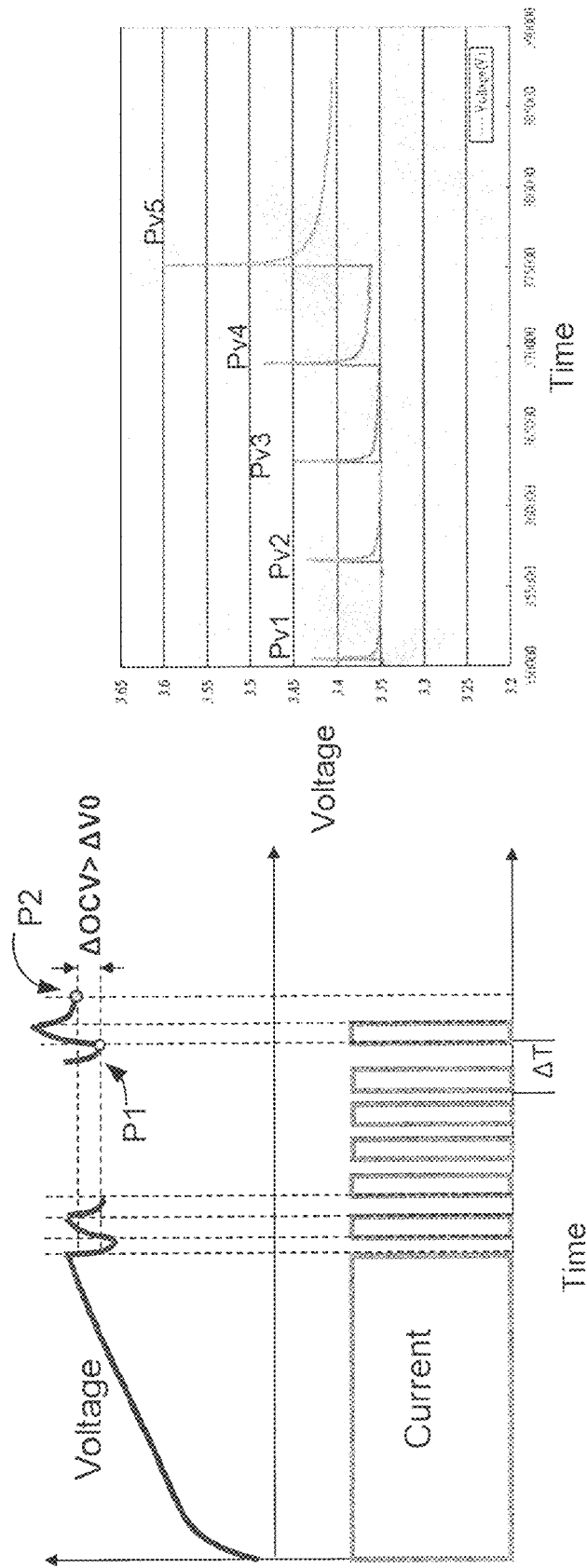
FIGS. 9A and 9B illustrate exemplary charging termination conditions consistent with a disclosed embodiment.

FIGS. 9A and 9B illustrate other exemplary charging termination conditions, which may be employed in step 715 and/or step 615. When charging battery 405, in the first stage, battery 405 is charged under a constant current. During the first stage, the voltage across battery 405 continuously increases, as shown in FIG. 9A. After battery 405 reaches a predetermined constant charging voltage, e.g., 3.6V, system 400 performs a second stage by charging battery 405 in a pulse current charging mode with a pulse current having a predetermined constant magnitude. Under the pulse current charging mode, the voltage across battery 405 fluctuates, as shown in FIG. 9A. Points P1 and P2 correspond to any two consecutive end points of two consecutive pulse current signal periods. A pulse current signal period is defined as ΔT shown in FIG. 9A, which includes a time period when a pulse current with the predetermined constant magnitude is applied and an immediately subsequent time period when no current is applied.

At points P1 and P2, battery 405 is at rest (e.g., when the next pulse current signal is about to be applied, but has not been applied), and at which open circuit voltage (OCV) values $V_{p1}$ and $V_{p2}$ are measured. System 400 determines, e.g., via determination unit 420, a difference $\Delta OCV = V_{p2} - V_{p1}$, which represents the fluctuation or variation of the OCV between two consecutive OCVs. Difference $\Delta OCV$ also represents a rate of change in the OCV. The charging termination condition is defined as when $\Delta OCV$ is greater than a predetermined value $\Delta V0$. When this condition is satisfied, system 400 determines that battery 405 has reached a fully charged state or a state close to the fully charged state. In other words, system 400 determines that battery 405 has reached an initialization state where a predetermined charging termination condition (e.g., $\Delta OCV > \Delta V0$) is satisfied. System 400 then terminates the charging process. System 400 places battery 405 at rest until it reaches an idling state. System 400 then starts a discharging process (e.g., step 730), which may be used for determining whether a look-up table correction process is needed, and if needed, for correcting the look-up table. The initialization state serves as a starting point for the discharging process.

Alternatively, in the pulse current charging mode, system 400 obtains values of peak voltages ($P_{v1}, P_{v2}, \ldots, P_{vn}$) at each pulse, as shown in FIG. 9B. System 400 calculates a difference between two adjacent peak voltages, e.g., $\Delta Vi = P_{vi+1} - P_{vi}$, where $i=1, 2, \ldots, n-1$, n being an integer, $n>2$. System 400 determines whether $\Delta Vi$ is greater than a predetermined value. If $\Delta Vi$ is greater than a predetermined value, system 400 determines that the charging termination condition has been satisfied, and that battery 405 has reached an initialization state. System 400 then terminates the charging process and places battery 405 at rest until it reaches an idling state. System 400 then starts a discharging process (e.g., step 730), which may be used for determining whether a look-up table correction process is needed, and if needed, for correcting the look-up table. The initialization state serves as a starting point for the discharging process. It is understood that the charging termination conditions discussed in connection with FIGS. 8A-9B may also be used as the charging termination conditions in the embodiments shown in FIGS. 5 and 6. For example, after using the constant current and constant voltage charging methods discussed above in connection with FIGS. 8A-8C, system 400 performs a pre-discharge process to discharge battery 405 by the predetermined amount of charge $Q_{dis}$ to reach an initialization state, which serves as a starting point for a second discharge process (e.g., step 640).

In steps 640 and 735, the actual amount of charge discharged $Q_{real}$ may be a predetermined amount or a random amount. In addition, as indicated in steps 665 and 760, PAN must be greater than $Q_{set1}$ in order to start a look-up table correction process (steps 670 and 765). If dAh<0 (i.e., $Q_{real} < Q_{table}$), this indicates that due to the degradation of battery 405, the look-up table gives an over estimate of the capacity. Because the lost capacity (due to degradation) may never be recovered again, the entire look-up table needs to be corrected. If dAh>0 (i.e., $Q_{real} > Q_{table}$), it indicates that the look-up table has been over-corrected at certain data points. Thus, a look-up table correction process may only correct certain data points in an over-corrected region without correcting the entire look-up table.

Figure 10:
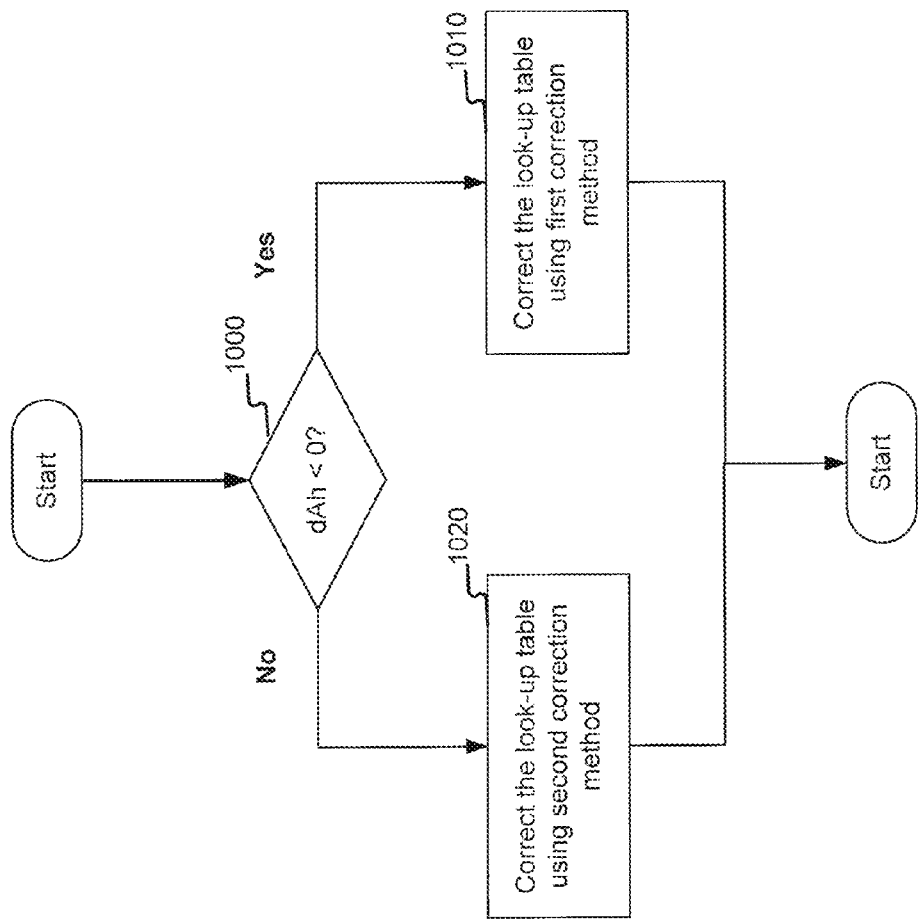
FIG. 10 illustrates an exemplary method for correcting a look-up table consistent with a disclosed embodiment.

FIG. 10 illustrates an exemplary process for correcting a look-up table. The process illustrated in FIG. 10 may be part of the look-up table correction process shown in step 670 of FIG. 6 or step 765 of FIG. 7. System 400 determines whether dAh is less than zero (step 1000). If dAh is less than zero, system 400 corrects the look-up table using a first correction method (step 1010). If dAh is greater than zero, system corrects the look-up table using a second correction method (step 1020). It is understood that if dAh is zero, look-up table correction process may not be performed.

Figure 11:
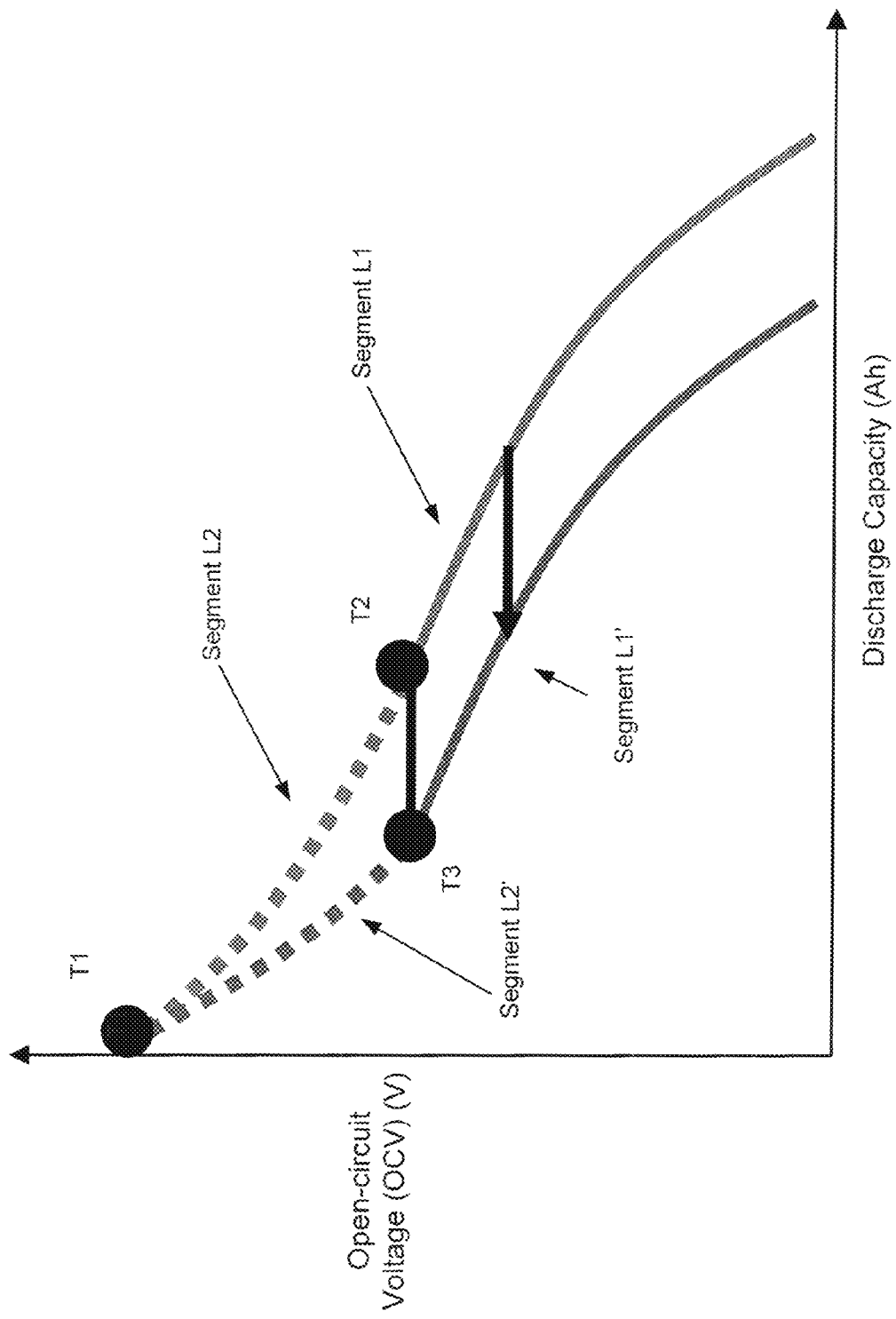
FIG. 11 illustrates an exemplary method for correcting a characteristic curve consistent with a disclosed embodiment.

FIG. 11 schematically illustrates an exemplary first correction method, which may be employed in step 1010 of FIG. 10. For illustrative purposes, the first correction method is described based on a characteristic curve representing OCV and discharge capacity. It is understood that the corresponding look-up table may be corrected according to data points on a corrected characteristic curve. For descriptive purposes, the original OCV-discharge capacity characteristic curve is assumed to be a discharge-mode characteristic curve, which is formed by segments L1 and L2. It is understood that a charge-mode characteristic curve may also be used for correcting the look-up table.

Referring to FIGS. 7 and 11, assuming after a discharging process (steps 730 to 745), battery 405 is in a state indicated by a point T3, where an actual discharge capacity $Q_{real}$ is measured. An OCV is also measured at point T3. A look-up capacity $Q_{table}$ is obtained from the look-up table based on the measured OCV. Point T2 denotes a point on the discharge-mode characteristic curve, which corresponds to the look-up capacity $Q_{table}$ and the measured OCV. At point T2, system 400 determines that dAh is less than zero (i.e., the actual capacity $Q_{real}$ is less than the look-up capacity $Q_{table}$). For each data point (OCV, capacity) on the characteristic curve having an OCV less than or equal to the measured OCV at points T2 and T3 (e.g., for each data point on segment L1), system 400 performs a correction by subtracting the capacity by PAN, while maintaining the corresponding OCV unchanged. As a result, after correction, point T2 is moved in parallel to the horizontal axis to point T3. Each point on segment L1 is moved horizontally in parallel to the horizontal axis towards 0 Ah by an amount of PAN. Segment L1 becomes replacement segment L1'.

Because point T2 has been moved to point T3, a singularity occurs at T3 between points on segment L2 and replacement segment L1' after segment L1 is moved. That is, the same OCV value corresponds to two points, one being point T3 on replacement segment L1', another being point T2 on segment L2. System 400 performs a further correction to remove the singularity. In the further correction, a suitable function is used to create a replacement segment L2' to smoothly connect point T1, the point with highest OCV on segment L2 (or the point corresponds to a maximum charged capacity), and point T3 on replacement segment L1'. This process is referred to as a "smoothing" process. Any suitable function, e.g., a linear function, a homogeneous polynomial function, may be used to create replacement segment L2' having a suitable number of data points to smooth the connection between T1 and T3. The corrected overall discharge-mode characteristic curve is formed by replacement segments L2' and L1'. The corrected characteristic curve is a smooth curve. For example, the corrected characteristic curve may be a monotonically decreasing curve (e.g., OCV monotonically decreases as discharge capacity increases or as remaining capacity decreases). The look-up table may be corrected based on data points from the corrected characteristic curve formed by replacement segments L2' and L1'.

Figure 12:
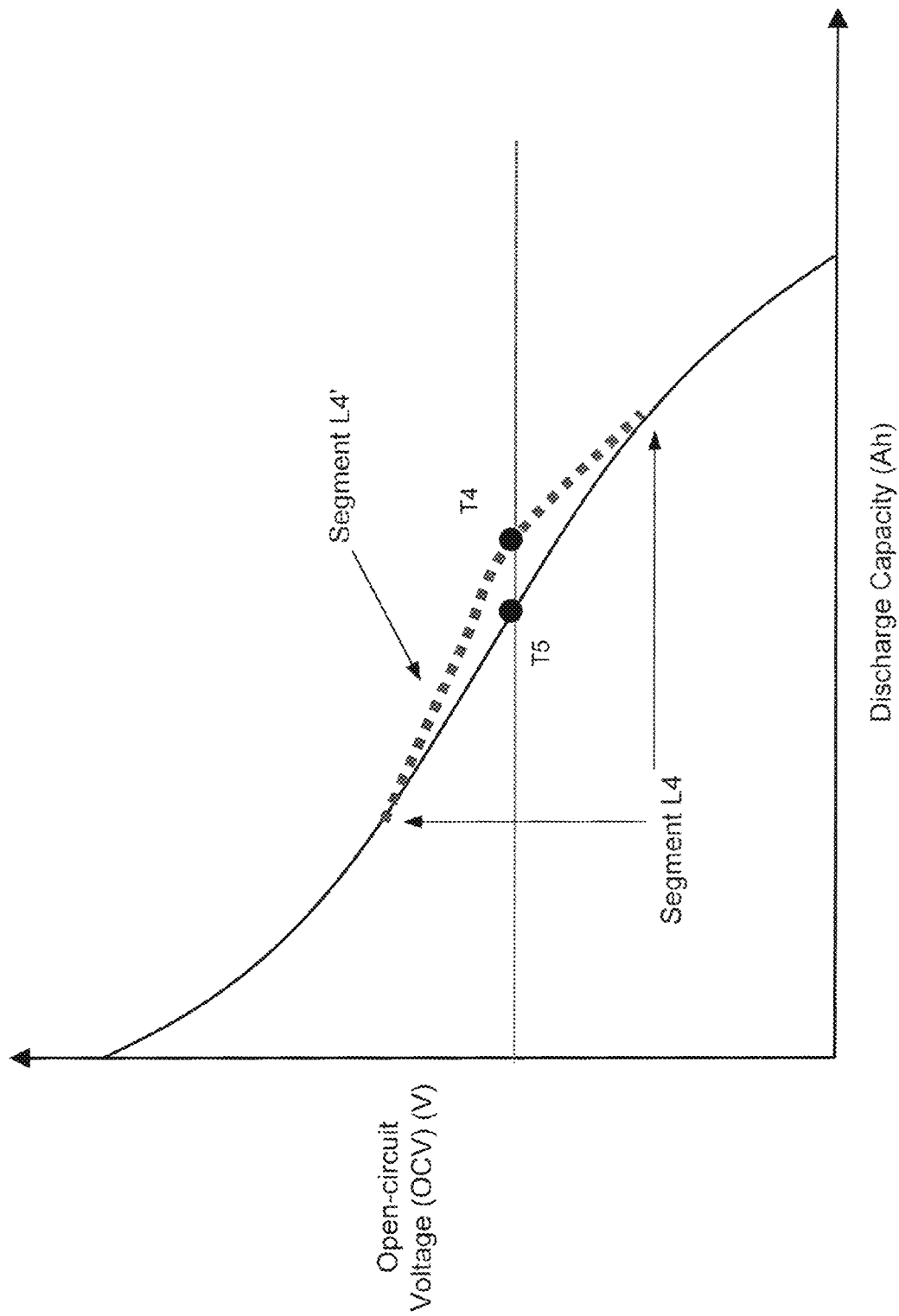
FIG. 12 illustrates an exemplary method for correcting a characteristic curve consistent with a disclosed embodiment.

FIG. 12 schematically illustrates an exemplary second correction method, which may be employed in step 1020 of FIG. 10. The original OCV-discharge capacity characteristic curve is represented by the solid curve including a point T5. At point T5, system 400 determines that dAh is greater than zero. This means at point T5, the actual capacity is greater than the look-up capacity. System 400 determines to correct only a regional segment L4 of the characteristic curve, which is located adjacent point T5 and encompasses point T5. Point T5 is corrected by adding PAN to the capacity at point T5, while maintaining the OCV unchanged. Thus, after correction, point T5 is moved to a point T4. A smooth curve denoted as replacement segment L4' is generated based on point T4 using a suitable function, and may be used to replace segment L4. A corrected characteristic curve is formed by replacing segment LA with replacement segment L4'. The corrected characteristic curve is a smooth curve. For example, the corrected characteristic curve may be a monotonically decreasing curve (e.g., OCV monotonically decreases as discharge capacity increases or as remaining capacity decreases). Any suitable function, such as a Gaussian function, a bell-shaped function, may be used for creating the smooth replacement segment L4'. The regional correction does not change the overall maximum capacity of battery 405.

When battery 405 includes a plurality of battery cells (this situation may also be referred to as when a battery pack or battery assembly includes a plurality of batteries), the plurality of battery cells can be treated as a single battery cell, regardless of whether each battery cell has different characteristic curves. Characteristic curves (discharge-mode and charge-mode) of overall battery 405 are obtained by treating the plurality of battery cells as a single battery cell. Accordingly, look-up tables of battery 405 are obtained based on the characteristic curves. The look-up table correction processes discussed above can be performed by treating the plurality of battery cells as a single battery cell.

In another embodiment, each battery cell may have its own look-up tables corresponding to the characteristic curves. For the overall battery, its characteristic curve and the look-up table may be selected from the plurality of curves and tables of the individual battery cells such that the selected curve (or table) has the lowest remaining capacity. For example, the remaining capacity displayed on display 460 may be the lowest remaining capacity selected from the remaining capacities of all of the battery cells.

After experiencing a discharging process (e.g., from point 2 to point 4 in FIG. 5), the OCV of battery 405 does not immediately enter a stable state after the discharging process is terminated. A stable state is defined based on the rest time after battery 405 is left at rest and/or a rate of change (e.g., change in the OCV versus time) in the OCV. For example, the stable state may be defined as a state when the battery has been left at rest for a predetermined amount of time, such as 20 minutes. The stable state may also be defined as a state when the rate of change in the OCV is smaller than a predetermined value (e.g., rate <1 mV/second). Because an unstable OCV value is not suitable for correcting the look-up table, if a continuous charging process immediately starts following a discharging process, an opportunity for correcting the look-up table may be lost. Thus, it may be necessary to delay the start of a continuous charging process following a discharging process so that a stable OCV is measured for correcting the look-up table.

In one embodiment, system 400 waits for a certain amount of time until the OCV reaches a stable state before charger 480 is connected. In another embodiment, after charger 480 is connected, system 400 waits for a certain amount of time until the OCV reaches a stable state before charger 480 actually starts continuously charging battery 405, even if the charger connecting signal indicates that charger 480 is connected to a power outlet. For example, if system 400 is implemented in an electricity-powered vehicle, and if the time when charger 480 is connected falls within a special time period (e.g., 10:00 PM-7:00 AM), it indicates that the vehicle will not be used within the next few hours. Thus, system 400 waits for a certain amount of time until the OCV reaches a stable state before charger 480 starts continuously charging battery 405.

Figure 13:
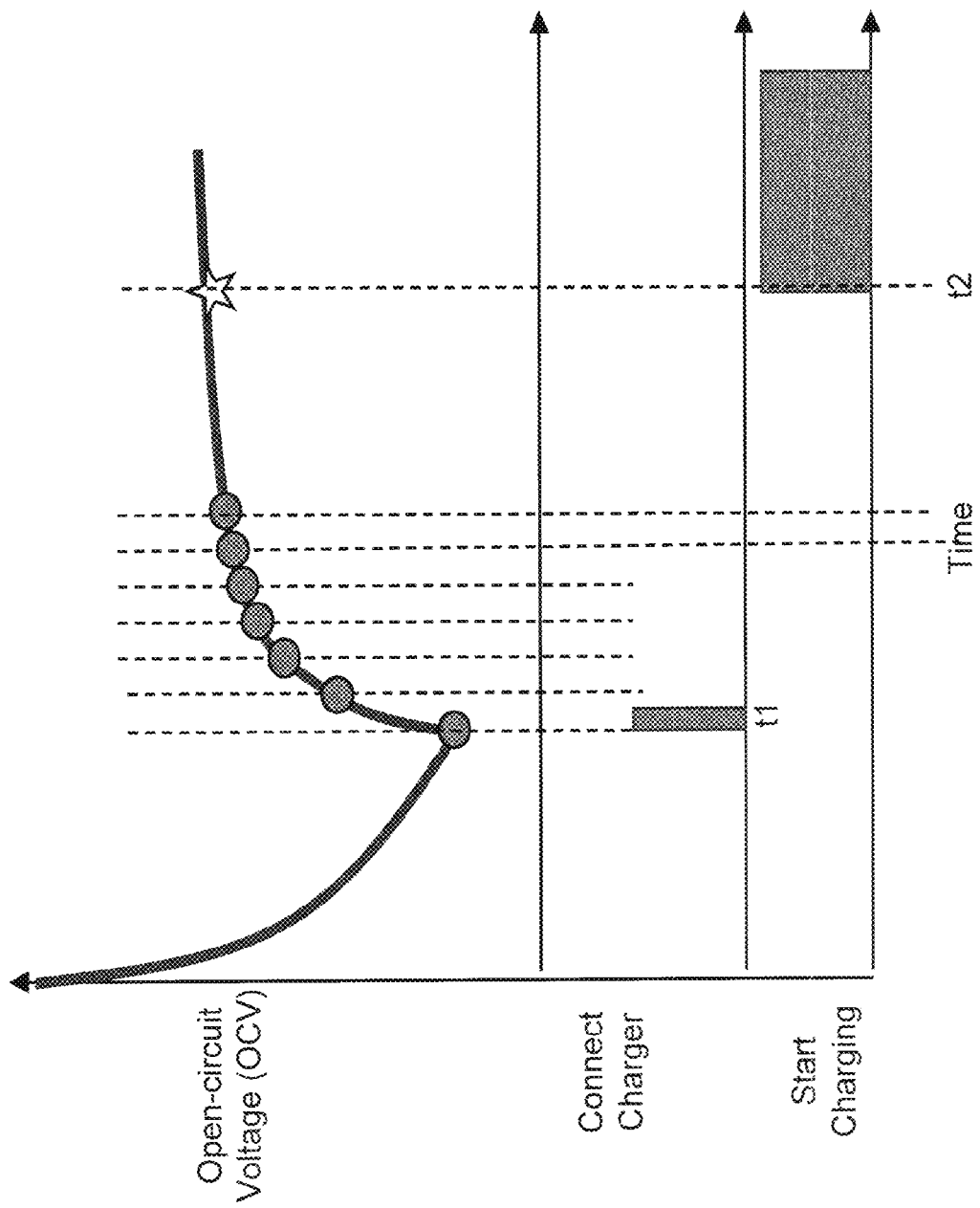
FIG. 13 illustrates an exemplary method for delaying start of a charging process consistent with a disclosed embodiment.

FIG. 13 illustrates an exemplary method for delaying the start of a continuous charging process. Assuming system 400 does not include immediate charge switch 490, or immediate charge switch 490 is not activated, if the OCV measured by voltage measuring unit 440 has not reached a stable state, even if charger 480 is connected to a power outlet, charger 480 will not immediately start a continuous charging process for battery 405 (e.g., because second switch 485 is in an open state). As illustrated in FIG. 13, charger 480 is connected to a power outlet at time t1, e.g., as indicated by the charger connecting signal. Before time t1, battery 405 is under a discharging process. At time t1 when charger 480 is connected to a power outlet, the OCV value has not reached a predetermined value. Thus, continuous charging is not started at time t1. Instead, system 400 waits until the OCV rises to reach a certain level, as schematically illustrated in the circles denoting increasing OCV in FIG. 13.

As illustrated in FIG. 13, from time t1 to time t2, the OCV increases. The rate of increase in the OCV may not be smaller than a predetermined value between time t1 and t2. The rate of increase in the OCV reduces from time t1 to t2, as indicated by the slope of the voltage curve. This indicates that the OCV becomes more stable from time t1 to t2. Although charger 480 is connected at time t1, because the OCV has not reached a stable state, actual continuous charging does not start until time t2. At time t2, which corresponds to the point denoted by a star on the OCV curve, system 400 determines that the OCV has reached a stable state because, e.g., battery 405 has been left at rest for a predetermined amount of time and/or the rate of change in the OCV is smaller than a predetermined value. At this point, system 400 obtains the OCV (e.g., measures the OCV using voltage measuring unit 440), uses the OCV to perform a look-up table correction process, and then starts the continuous charging process for battery 405 at time t2 after the look-up table correction process is performed. Thus, in this embodiment, after charger 480 is connected, system 400 waits for an amount of time equal to (t2−t1) before actual starting the continuous charging process after charger 480 is connected. This amount of time (t2−t1) is related to the rate of change of the OCV. That is, t2 may be defined as the time when the rate of change in the OCV becomes smaller than a predetermined value.

Figure 14:
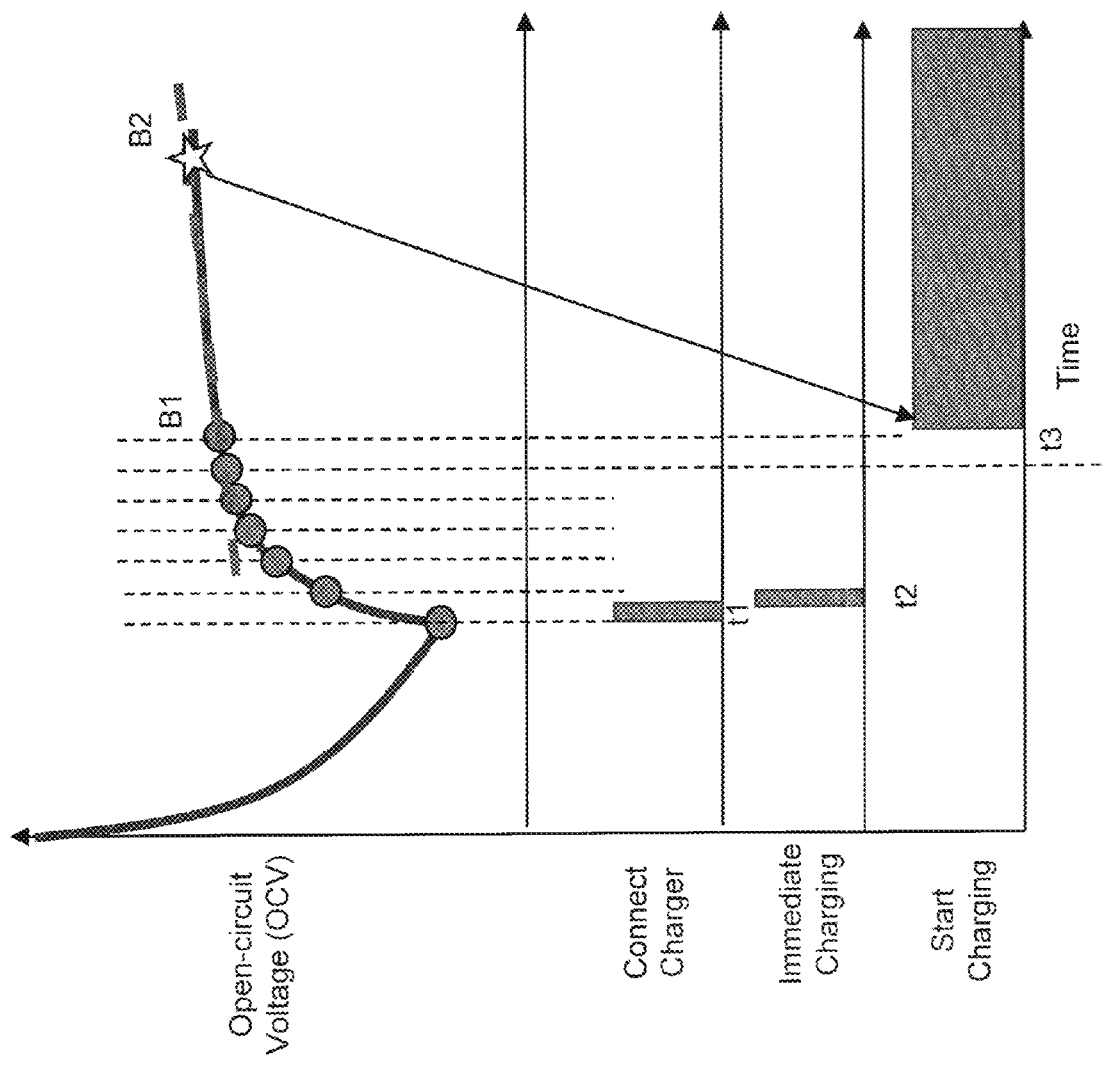
FIG. 14 illustrates an exemplary method for delaying start of a charging process consistent with a disclosed embodiment.

FIG. 14 illustrates another exemplary method for delaying the start of a continuous charging process after charger 480 is connected to a power outlet. Before time t1, battery 405 is in a discharging process. At time t1, charger 480 is connected to a power outlet. A user of system 400 may wish to immediately start charging battery 405 without waiting for the OCV to reach a stable state. Thus, the user of system 400 activates immediate charge switch 490 at time t2. For example, control unit 425 detects or receives an immediate charge signal from immediate charge switch 490. At time t2, the OCV of battery 405 has not reached a stable state. System 400 may wait until the OCV of battery 405 rises to reach a certain level. For example, system 400 may wait for a certain amount of time until the OCV reaches point B1 (corresponding to time t3), where battery 405 is determined to have reached a state that is close to a stable state (e.g., the rate of change in the OCV is smaller than a predetermined value). System 400 performs a prediction process using, e.g., any suitable extrapolation method known in the art, at point B1 based on the rate of change at point B1, to obtain a point B2 as an estimated point where the corresponding OCV may be regarded as in a stable state (e.g., a predicted stable OCV). Thus, the predicted stable OCV at point B2 is used to perform a look-up table correction process. After the look-up table correction process is performed, the continuous charging process is started at time t3. The same prediction process described above may be applied in situations when battery 405 enters charging mode, e.g., by connecting charger 480, out of the special time period (e.g., 10:00 PM-7:00 AM) described above.

Figure 15:
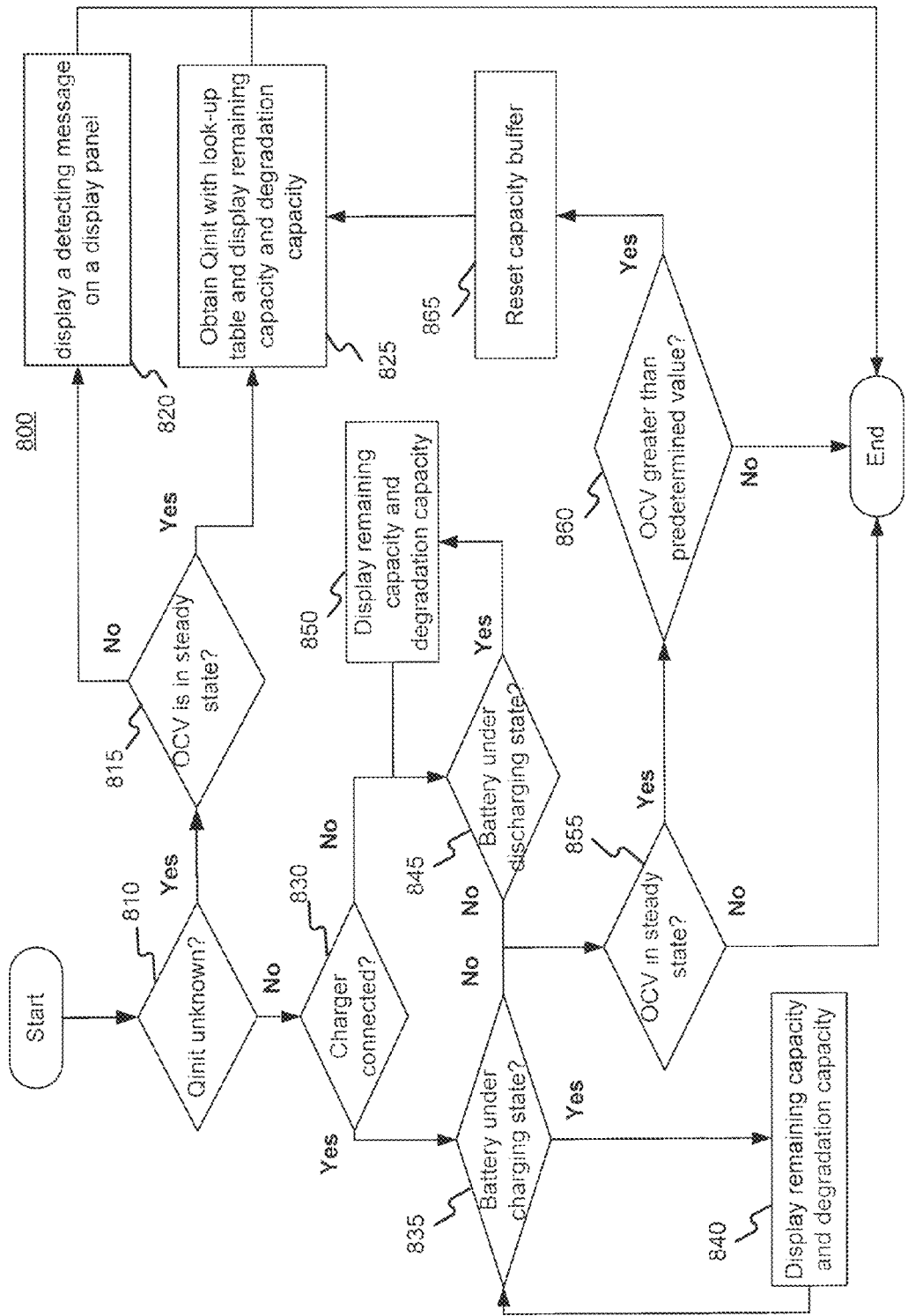
FIG. 15 illustrates an exemplary method for calculating and displaying remaining capacity consistent with a disclosed embodiment.

FIG. 15 illustrates an exemplary process 800 for calculating and displaying the remaining capacity and degradation capacity of battery 405. System 400 determines, e.g., via determination unit 420, whether the initial capacity $Q_{init}$ is unknown (step 810). If $Q_{init}$ is unknown (Yes, step 810), which indicates that system 400 cannot use coulomb counting or current integration methods to calculate the actual discharge capacity, then system 400 determines whether the open-circuit voltage (OCV) of battery 405 is in a steady or stable state, e.g., based on the amount of time battery 405 has been left at rest or the rate of change in the OCV (step 815). If the OCV of battery 405 is not in a steady state (No, step 815), system 400 displays a message on a display panel indicating that system 400 is still detecting a stable OCV (step 820). For example, system 400 may display "Detecting" on display 460. System 400 terminates process 800 after displaying the detecting message. Alternatively, system 400 may repeat step 815 after executing step 820.

If the OCV is in a steady state (Yes, step 815), system 400 obtains $Q_{init}$ from a look-up table based on the OCV, calculates the remaining capacity based on $Q_{init}$ and displays the remaining capacity and the degradation capacity, e.g., on display 460 (step 825). If the OCV is greater than a predetermined value (e.g., OCV>3.43V), which indicates that battery 405 has reached an idling state (e.g., "Yes" in step 625 of FIG. 6 or step 720 of FIG. 7), system 400 will perform, in process 600 or 700, a look-up table correction process.

If $Q_{init}$ is not unknown (i.e., is known) (No, step 810), system 400 determines, e.g., via determination unit 420 and based on the charger connecting signal received from charger 480, whether charger 480 is connected to a power outlet (step 830). If charger 480 is connected to a power outlet (Yes, step 830), system 400 determines whether battery 405 is under a charging state (step 835). If battery 405 is under a charging state (Yes, step 835), system 400 displays, e.g., on display 460, the remaining capacity and degradation capacity (step 840). The remaining capacity may be calculated from $A_{real}=Q_{max}-Q_{real}$, where $Q_{max}$ is the maximum capacity of battery 405 according to the look-up table. $Q_{real}$ may be calculated from $Q_{real}=Q_{init}+Q_1-Q_{ch}$, where $Q_1$ is the amount of charge discharged by battery 405, which may be measured by first charge measuring unit 451, e.g., using a current integration method, and $Q_{ch}$ is the amount of charge with which battery 405 is charged, which may be measured by second charge measuring unit 452, e.g., using a current integration method. After performing step 840, system 400 repeats step 835. The degradation capacity $Q_{deg}$ is calculated from $Q_{deg}=Q_{fresh}-Q_{max}$.

If charger 480 is not connected to a power outlet (No, step 830), system 400 determines whether battery 405 is under a discharging state (step 845). If battery 405 is under a discharge state (Yes, step 845), system 400 displays the remaining capacity and degradation capacity (step 850). Step 850 is similar to step 840 discussed above. If battery 405 is not under a charging state (No, step 835), or battery 405 is not under a discharging state (No, step 845), system 400 determines whether the OCV of battery 405 is in a steady state (step 855). Step 855 is similar to step 815 discussed above. If battery 405 is not under a steady state (No, step 855), system 400 terminates process 800. If battery 405 is under a steady state (Yes, step 855), system 400 determines whether the OCV is greater than a predetermined value (e.g., 3.43 V). If system 400 determines that the OCV is greater than a predetermined value (Yes, step 860), system 400 resets a capacity buffer, such as a memory, e.g., by resetting at least one of the temporarily stored values of $Q_1$, $Q_{init}$, and $Q_{ch}$ to zero (step 865). System 400 then repeats step 825 to obtain $Q_{init}$ using a look-up table based on the OCV, calculates the remaining capacity (e.g., based on $A_{real}=Q_{max}-Q_{real}$, where $Q_{real}=Q_{init}$) and the degradation capacity (e.g., based on $Q_{deg}=Q_{fresh}-Q_{max}$), and displays the remaining capacity and the degradation capacity, e.g., on display 460. If system 400 determines that the OCV is not greater than the predetermined value (No, step 860), system 400 terminates process 800. After system 400 terminates process 800, system 400 may restart process 800 by performing step 810.

The disclosed methods and systems may be employed in systems where batteries are utilized for providing power. In particular, the disclosed methods and systems may be employed in system where accurate estimation of the capacity of batteries is desired. For example, when batteries are employed in electricity-powered vehicles, batteries may be alternately charged and discharged. The disclosed systems may include hardware and/or software components for performing the disclosed methods. For example, the disclosed systems may include computers having processors, memories, and storage devices. The disclosed systems may also include computer readable media configured to record program codes, which when executed by a computer, perform the disclosed methods for estimating a capacity of a battery. The disclosed methods may improve the accuracy in estimating the capacity, such as the remaining capacity, of a battery.

It will be apparent to those skilled in the art that various modifications and variations can be made to the disclosed methods and systems for estimating the capacity of a battery. It is intended that the specification and examples be considered as exemplary only, with a true scope of the disclosure being indicated by the following claims and their equivalents.

What is claimed is:

1. A method for estimating a capacity of a battery, comprising:
    providing a look-up table storing data pairs each having a look-up voltage and a look-up capacity of the battery;
    initializing the battery to reach an initialization state which serves as a starting point for a discharging process;
    discharging the battery, from the initialization state, by a first amount of charge to reach a first state;
    calculating an actual capacity of the battery based on a measured amount of charge discharged from the initialization state to the first state;
    measuring an open-circuit voltage at the first state;
    obtaining a first look-up capacity of the battery from the look-up table according to the open-circuit voltage measured at the first state;
    calculating a difference by subtracting the first look-up capacity from the actual capacity;
    calculating an absolute value of the difference; and
    correcting the look-up table using a first correction method when the difference is less than zero and using a second correction method when the difference is greater than zero, the second correction method being different from the first correction method,
    wherein the first correction method comprises:
        for each first data pair in the look-up table having the look-up voltage less than or equal to the open-circuit voltage, updating the look-up capacity of each first data pair by subtracting the calculated absolute value from the look-up capacity of each first data pair; and for each second data pair in the look-up table having the look-up voltage greater than the open-circuit voltage, replacing each second data pair with one of a first set of new data pairs generated to connect a data pair having the first look-up capacity and the open-circuit voltage, and a data pair in the look-up table having a highest look-up voltage, wherein the first set of new data pairs define a smooth curve.

2. The method of claim 1, wherein initializing the battery comprises:

performing a pre-discharge process comprising:
discharging the battery by a second amount of charge to reach a second state, the second state being the initialization state.

3. The method of claim 2, wherein performing the pre-discharge process comprises:

discharging the battery until an amount of discharged charge reaches a predetermined value; and measuring an open-circuit voltage and obtaining an initial capacity corresponding to the initialization state from the look-up table.

4. The method of claim 2, wherein in the pre-discharging process, discharging the battery by a second amount of charge comprises:

discharging the battery by the second amount of charge using at least one of an energy dissipating device or an energy storage device.

5. The method of claim 1, wherein initializing the battery comprises:

charging the battery until the battery reaches the initialization state where a predetermined charging termination condition is satisfied.

6. The method of claim 5, wherein the predetermined charging termination condition is satisfied when at least one of following conditions is satisfied:

a charging voltage is greater than a predetermined voltage or a charging current is smaller than a predetermined current, and the method further comprising terminating the charging when the predetermined charging termination condition is satisfied.

7. The method of claim 6, further comprising:

adjusting the predetermined charging termination condition by at least one of the following:
increasing the charging voltage; or
decreasing the charging termination current.

8. The method of claim 5, wherein charging the battery until the battery reaches the initialization state comprises:

charging the battery with a constant charging current;
charging the battery with a pulse current after a voltage across the battery has reached a predetermined voltage value;

measuring at least two open-circuit voltages at an end of each of at least two pulse current periods;

calculating a rate of change based on the at least two open-circuit voltages;

determining whether the rate of change exceeds a predetermined value; and terminating charging the battery when determining that the rate of change exceeds the predetermined value.

9. The method of claim 1, wherein initializing the battery comprises:

charging the battery in a first stage using a constant current;
charging the battery in a second stage using a constant voltage until the charged capacity of the battery is greater than a predetermined value; and
discharging the battery by a certain amount of charge to reach the initialization state.

10. The method of claim 1, wherein calculating an actual capacity of the battery based on a measured amount of charge discharged from the initialization state to the first state comprises:

obtaining an initial capacity corresponding to the initialization state from the lookup table; and
calculating the actual capacity by summing a capacity obtained based on the measured amount of charge discharged and the initial capacity.

11. The method of claim 1, wherein calculating an actual capacity of the battery based on a measured amount of charge discharged from the initialization state to the first state comprises:

obtaining an initial capacity corresponding to the initialization state from the look-up table; and
calculating the actual capacity by summing a capacity obtained based on the measured amount of charge discharged and the initial capacity, and subtracting an amount of charge with which the battery is charged.

12. The method of claim 1, wherein the first set of new data pairs forms a monotonically decreasing smooth curve by which voltage monotonically decreases as capacity increases.

13. The method of claim 1, wherein the second set of new data pairs forms a monotonically decreasing smooth curve by which voltage monotonically decreases as capacity increases.

14. The method of claim 1, further comprising:

delaying start of a charging process after determining that a charger is connected until the open-circuit voltage reaches a stable state and until the open-circuit voltage is measured and correcting the look-up table is performed.

15. The method of claim 1, further comprising:

after detecting an immediate charge signal,
observing a rate of change of the open-circuit voltage;
after the open-circuit voltage reaches a first point where the rate of change is smaller than a predetermined value, predicting a stable open-circuit voltage;
correcting the look-up table using the predicted stable open-circuit voltage; and
starting charging the battery after the look-up table is corrected.

16. The method of claim 15, wherein predicting the stable open-circuit voltage comprises:

estimating the stable open-circuit voltage based on the rate of change at the first point and an extrapolation method.

17. The method of claim 1, wherein when the battery includes a plurality of battery cells, the plurality of battery cells are treated as a single cell in establishing the look-up table and in correcting the look-up table.

18. The method of claim 1, wherein when the battery includes a plurality of battery cells, the capacity of the battery equals a lowest capacity from a plurality of capacities respectively corresponding to the plurality of battery cells.

19. The method of claim 1, further comprising:

calculating a remaining capacity of the battery based on $A_{real}=Q_{max}-Q_{real}$, wherein $A_{real}$ denotes the remaining capacity, $Q_{max}$ denotes maximum capacity of the battery obtained from the look-up table, and $Q_{real}$ denotes the actual discharge capacity of the battery;

calculating a degradation capacity of the battery based on $Q_{deg}=Q_{dresh}-Q_{max}$, wherein $Q_{deg}$ denotes the degradation capacity, and $Q_{fresh}$ denotes a nominal maximum capacity when battery is new; and displaying the remaining capacity and the degradation capacity.

20. The method of claim 1, wherein the second correction method comprises:

for the data pair having the first look-up capacity and open-circuit voltage, updating the first look-up capacity by adding the absolute value of the difference to the first look-up capacity and generating an updated first look-up capacity;

generating a replacement data pair having the updated first look-up capacity and the open-circuit voltage;

identifying a portion of the data pairs, stored in the look-up table to be updated, the portion including the data pair having the first look-up capacity and the open-circuit voltage;

generating a second set of new data pairs based on the replacement data pair, the second set of new data pairs forming a smooth curve including the replacement data pair; and replacing the identified portion of data pairs with the second set of new data pairs.

21. A non-transitory computer-readable medium, encoded with computer program code, which when executed by a computer, performs a method for estimating a capacity of a battery, the method comprising:

providing a look-up table storing data pairs each having a look-up voltage and a look-up capacity of the battery;

initializing the battery to reach an initialization state which serves as a starting point for a discharging process;

discharging the battery, from the initialization state, by a first amount of charge to reach a first state;

calculating an actual capacity of the battery based on a measured amount of charge discharged from the initialization state to the first state;

measuring an open-circuit voltage at the first state;

obtaining a first look-up capacity of the battery from the look-up table according to the open-circuit voltage measured at the first state;

calculating a difference by subtracting the first look-up capacity from the actual capacity;

calculating an absolute value of the difference; and correcting the look-up table using a first correction method when the difference is less than zero and using a second correction method when the difference is greater than zero, the second correction method being different from the first correction method, wherein the first correction method comprises:

for each first data pair in the look-up table having the look-up voltage less than or equal to the open-circuit voltage, updating the look-up capacity of each first data pair by subtracting the calculated absolute value from the look-up capacity of each first data pair; and for each second data pair in the look-up table having the look-up voltage greater than the open-circuit voltage, replacing each second data pair with one of a first set of new data pairs generated to connect a data pair having the first look-up capacity and the open-circuit voltage, and a data pair in the look-up table having a highest look-up voltage wherein the first set of new data define a smooth curve.

22. The nontransitory computer-readable medium of claim 21, wherein initializing the battery comprises:

performing a pre-discharge process comprising:

discharging the battery by a second amount of charge to reach a second state, the second state being the initialization state.

23. The nontransitory computer-readable medium of claim 21, wherein initializing the battery comprises:

charging the battery until the battery reaches the initialization state where a predetermined charging termination condition is satisfied.

24. A system for estimating a capacity of a battery, comprising:

a capacity estimation apparatus configured to initialize the battery to reach an initialization state which serves as a starting point for a discharging process;

a control unit configured to generate a control signal; and a load configured to receive the control signal from the control unit and controlled by the control unit to discharge the battery, from the initialization state, by a first amount of charge to reach a first state;

wherein the capacity estimation apparatus comprises:

a storage unit configured to store a look-up table storing data pairs each having a look-up voltage and a look-up capacity of the battery;

a charge measuring unit configured to calculate an actual capacity of the battery based on a measured amount of charge discharged from the initialization state to the first state;

a voltage mea ring unit configured to measure an open-circuit voltage at the first state; and a processor configured to:

obtain a first look-up capacity of the battery from the look-up table according to the open-circuit voltage measured at the first state;

calculate a difference by subtracting the first look-up capacity from the actual capacity;

calculating an absolute value of the difference and correct the look-up table using a first correction method when the difference is less than zero and using a second correction method when the difference is greater than zero, the second correction method being different from the first correction method, wherein the first correction method comprises:

for each first data pair in the look-up table having the look-up voltage less than or equal to the open-circuit voltage, updating the look-up capacity of each first data pair by subtracting the calculated absolute value from the look-up capacity of each first data pair; and for each second data pair in the look-up table having the look-up voltage greater than the open-circuit voltage, replacing each second data pair with one of a first set of new data pairs generated to connect a data pair having the first look-up capacity and the open-circuit voltage, and a data pair in the look-up table having a highest look-up voltage wherein the first set of new data pairs define smooth curve.

25. The system of claim 24, wherein the load is further configured to be controlled by the control unit to:
  perform a pre-discharge process comprising:
    discharging the battery by a second amount of charge to reach a second state, the second state being the initialization state.

26. The system of claim 24, wherein the capacity estimation apparatus is configured to charge the battery until the battery reaches the initialization state where a predetermined charging termination condition is satisfied.

* * * * *

UNITED STATES PATENT AND TRADEMARK OFFICE
CERTIFICATE OF CORRECTION

| | | |
|---|---|---|
| PATENT NO. | : 9,146,280 B2 | Page 1 of 1 |
| APPLICATION NO. | : 13/282039 | |
| DATED | : September 29, 2015 | |
| INVENTOR(S) | : Chein-Chung Sun et al. | |

It is certified that error appears in the above-identified patent and that said Letters Patent is hereby corrected as shown below:

IN THE CLAIMS

Claim 24, Col. 26, Line 35, "mear ring" should read as --measuring--.

Signed and Sealed this
Twenty-second Day of March, 2016

Michelle K. Lee
*Director of the United States Patent and Trademark Office*